United States Patent
Hansen et al.

(10) Patent No.: US 11,029,594 B2
(45) Date of Patent: Jun. 8, 2021

(54) OPTIMIZATION OF A LITHOGRAPHY APPARATUS OR PATTERNING PROCESS BASED ON SELECTED ABERRATION

(71) Applicant: ASML NETHERLANDS B.V., Veldhoven (NL)

(72) Inventors: Steven George Hansen, Phoenix, AZ (US); Kateryna Stanislavovna Lyakhova, Veldhoven (NL); Paulus Jacobus Maria Van Adrichem, Wijchen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/332,075

(22) PCT Filed: Aug. 30, 2017

(86) PCT No.: PCT/EP2017/071686
§ 371 (c)(1),
(2) Date: Mar. 11, 2019

(87) PCT Pub. No.: WO2018/050432
PCT Pub. Date: Mar. 22, 2018

(65) Prior Publication Data
US 2019/0369480 A1 Dec. 5, 2019

Related U.S. Application Data

(60) Provisional application No. 62/394,085, filed on Sep. 13, 2016.

(51) Int. Cl.
*G06F 30/33* (2020.01)
*G03F 1/36* (2012.01)
(Continued)

(52) U.S. Cl.
CPC ............ *G03F 1/36* (2013.01); *G03F 7/70125* (2013.01); *G03F 7/70866* (2013.01);
(Continued)

(58) Field of Classification Search
CPC .. G03F 7/705; G03F 7/70625; G03F 7/70441; G03F 1/70; G03F 7/70666;
(Continued)

(56) References Cited

U.S. PATENT DOCUMENTS

| | | |
|---|---|---|
| 5,969,441 A | 10/1999 | Loopstra et al. |
| 6,046,792 A | 4/2000 | Van Der Werf et al. |

(Continued)

FOREIGN PATENT DOCUMENTS

WO 2016096309 6/2016

OTHER PUBLICATIONS

International Search Report and Written Opinion issued in corresponding PCT Patent Application No. PCT/EP2017/071686, dated Dec. 7, 2017.

(Continued)

*Primary Examiner* — Binh C Tat
(74) *Attorney, Agent, or Firm* — Pillsbury Winthrop Shaw Pittman LLP

(57) ABSTRACT

A method including obtaining a selected component of optical aberration of or for a lithography apparatus, under a processing condition; computing an approximate of a cost function, based on the selected component; and producing an adjustment of the lithography apparatus or a patterning process that uses the lithography apparatus, based on the approximate of the cost function.

21 Claims, 21 Drawing Sheets

(51) Int. Cl.
  *G03F 7/20* (2006.01)
  *G06F 17/10* (2006.01)
  *G06F 30/398* (2020.01)
(52) U.S. Cl.
  CPC ............ *G06F 17/10* (2013.01); *G06F 30/398* (2020.01); *G03F 7/70441* (2013.01)
(58) Field of Classification Search
  CPC ............ G03F 7/70866; G03F 7/70608; G03F 9/7019; G03F 1/36; G03F 7/70283; G03F 7/70433; G03F 1/72; G03F 7/70191; G03F 7/70483; H01L 27/14625; H01L 27/14632; G01N 21/9501; G01N 21/956; G06F 30/398; G06F 30/367; G06F 1/163; G06F 2119/18; G06F 3/013; G06F 2111/04; G06F 30/3323; G06F 3/005; G06F 3/011; G06F 3/017; G06F 2111/10; G06F 30/30; G06F 17/10; G06F 17/12; G06F 2119/22; G06F 2203/0331; G06F 3/04842; G06F 3/14; G06F 30/33
  USPC ...................................................... 716/50–56
  See application file for complete search history.

(56) References Cited

U.S. PATENT DOCUMENTS

| | | |
|---|---|---|
| 7,587,704 B2 | 9/2009 | Ye et al. |
| 2002/0183994 A1 | 12/2002 | Fuse |
| 2009/0157360 A1 | 6/2009 | Ye et al. |
| 2012/0113404 A1* | 5/2012 | Hsu .................... G03F 7/70066 355/67 |
| 2012/0117522 A1* | 5/2012 | Feng .................. G03F 7/70125 716/54 |
| 2012/0303151 A1 | 11/2012 | Ye et al. |
| 2015/0153651 A1 | 6/2015 | Feng et al. |
| 2015/0378262 A1* | 12/2015 | Liu .................... G03F 7/70116 355/77 |

OTHER PUBLICATIONS

Taiwanese Office Action issued in corresponding Taiwanese Patent Application No. 106130911, dated Dec. 10, 2018.

* cited by examiner

US 11,029,594 B2

OPTIMIZATION OF A LITHOGRAPHY APPARATUS OR PATTERNING PROCESS BASED ON SELECTED ABERRATION

CROSS REFERENCE TO RELATED APPLICATIONS

This application is the U.S. national phase entry of PCT patent application no. PCT/EP2017/071686, which was filed on Aug. 30, 2017, which claims the benefit of priority of U.S. provisional application no. 62/394,085, which was filed on Sep. 13, 2016, and which is incorporated herein in its entirety by reference.

TECHNICAL FIELD

The description herein relates to lithographic apparatuses and processes, and more particularly to a method or apparatus to optimize an illumination mode, a patterning device, or a projection system for use in a lithographic apparatus or process, based on a selected aberration that has a significant impact on the lithographic apparatus or process.

BACKGROUND

A lithography apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithography apparatus, one target portion at a time. In one type of lithography apparatuses, the circuit pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithography apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithography apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithography apparatus are printed, is commonly known as low-$k_1$ lithography, according to the resolution formula $CD=k_1 \times \lambda/NA$, where $\lambda$ is the wavelength of radiation employed, NA is the numerical aperture of projection system in the lithography apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithography apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection system" as used herein should be broadly interpreted as encompassing various types of optical systems, including refractive optics, reflective optics, apertures and/or catadioptric optics, for example. The term "projection system" may also include components operating according to any of these design types for directing, shaping or controlling the projection beam of radiation, collectively or singularly.

SUMMARY

In an embodiment, there is provided a method comprising: obtaining a selected component of optical aberration of or for a lithography apparatus, under a processing condition; computing, by a hardware computer system, an approximate of a cost function, based on the selected component of optical aberration; and producing an adjustment for the lithography apparatus or a patterning process that uses the lithography apparatus, based on the approximate of the cost function.

Also disclosed herein is a computer program product comprising a computer non-transitory readable medium having instructions recorded thereon, the instructions when executed by a computer implementing any of the methods herein.

DETAILED DESCRIPTION

Figure 1:
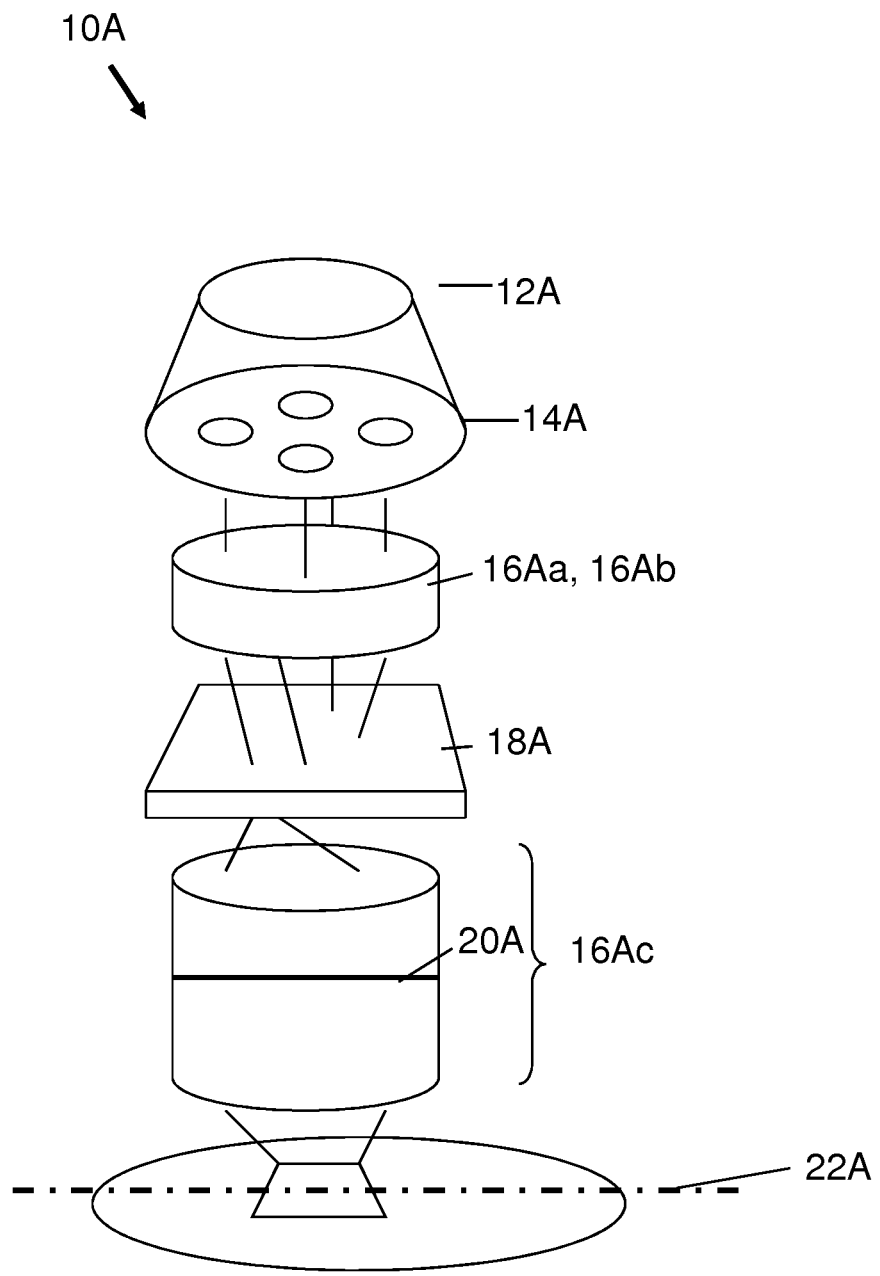
FIG. 1 is a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "optimizing" and "optimization" as used herein refers to or means adjusting a patterning apparatus (e.g., a lithography apparatus), a patterning process, etc. such that results and/or processes have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Further, the lithography apparatus may be of a type having two or more tables (e.g., two or more substrate table, a substrate table and a measurement table, two or more patterning device tables, etc.). In such "multiple stage" devices a plurality of the multiple tables may be used in parallel, or preparatory steps may be carried out on one or more tables while one or more other tables are being used for exposures. Twin stage lithography apparatuses are described, for example, in U.S. Pat. No. 5,969,441, incorporated herein by reference.

The patterning device referred to above comprises, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be referred to as "critical dimensions"

(CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.

a programmable LCD array.

As a brief introduction, FIG. 1 illustrates an exemplary lithography apparatus 10A. Major components are a radiation source 12A, which may be a deep-ultraviolet excimer laser source or other type of source including an extreme ultra violet (EUV) source (as discussed above, the lithography apparatus itself need not have the radiation source), illumination optics which define the partial coherence (denoted as sigma) of illumination and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection system may restrict the range of beam angles that impinge on the substrate plane 22A, where the largest possible angle defines the numerical aperture of the projection system NA=n sin($\Theta_{max}$), n is the Index of Refraction of the media between the last element of projection system and the substrate, and $\Theta_{max}$ is the largest angle of the beam exiting from the projection system that can still impinge on the substrate plane 22A.

In an optimization process of a system, a figure of merit of the system can be represented as a cost function. The optimization process boils down to a process of finding a set of parameters (design variables) of the system that optimizes (e.g., minimizes or maximizes) the cost function. The cost function can have any suitable form depending on the goal of the optimization. For example, the cost function can be weighted root mean square (RMS) (or root mean 2n-th power, where n is a positive integer) of deviations of certain characteristics of the system with respect to the intended values (e.g., ideal values) of these characteristics; the cost function can also be the maximum of these deviations (i.e., worst deviation). The design variables of the system can be confined to finite ranges and/or be interdependent due to practicalities of implementations of the system. In the case of a lithography apparatus, the constraints are often associated with physical properties and characteristics of the hardware such as tunable ranges, and/or patterning device manufacturability design rules.

In a lithography apparatus, an illumination system provides illumination (i.e. radiation) in the form of an illumination mode to a patterning device and the projection system directs and shapes the illumination, via the patterning device, onto a substrate. The illumination mode defines the characteristics of the illumination, such as the spatial intensity distribution (e.g., conventional, dipole, annular, quadrupole, etc.). The term "projection system" is broadly defined here to include any optical component that may alter the wavefront of the radiation beam. For example, projection system may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithography apparatus (e.g., properties of the illumination mode, the patterning device and the projection system) dictate the aerial image. Since the patterning device used in the lithography apparatus can be changed, it may be desirable to separate the optical properties of the patterning device from the optical properties of the rest of the lithography apparatus including at least the illumination system and the projection system.

Figure 2:
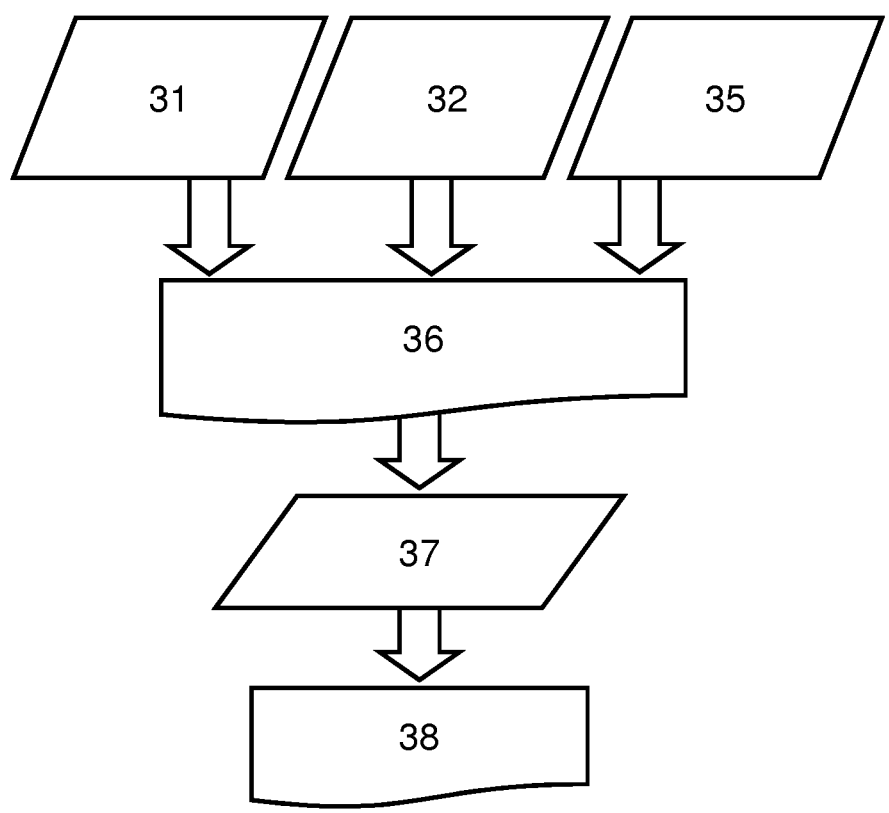
FIG. 2 is a block diagram of simulation models corresponding to subsystems in FIG. 1.

An exemplary flow chart for simulating lithography in a lithography apparatus is illustrated in FIG. 2. An illumination model 31 represents optical characteristics (including radiation intensity distribution and/or phase distribution) of the illumination provided to the patterning device. A projection system model 32 represents optical characteristics (including changes to the radiation intensity distribution and/or the phase distribution caused by the projection system) of the projection system. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection system model 32 and the design layout model 35. A resist image 38 can be simulated from the aerial image 36 using a resist model 37. Simulation of lithography can, for example, predict contours and CDs in the resist image.

More specifically, it is noted that the illumination model 31 can represent the optical characteristics of the illumination mode and/or illumination system that include, but not limited to, a numerical aperture setting, an illumination sigma ($\sigma$) setting, a particular illumination shape (e.g. off-axis radiation illumination such as annular, quadrupole, dipole, etc.), etc. The projection system model 32 can represent the optical characteristics of the projection system, including aberration, distortion, one or more refractive indexes, one or more physical sizes, one or more physical dimensions, etc. The design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a user, e.g., chipmaker), by trial and error, or by running a full-chip simulation. Clips may contain one or more test patterns or gauge patterns.

An initial larger set of clips may be provided a priori by a user based on one or more known critical feature areas in a design layout which require particular image optimization. Alternatively, in another embodiment, an initial larger set of clips may be extracted from the entire design layout by using some kind of automated (such as machine vision) or manual algorithm that identifies the one or more critical feature areas.

The optimization may be directed to enlarge the process windows of some of the patterns in the design layout. The process window of a pattern is a space of the processing parameters under which the pattern will be produced within specifications. From a mathematical point of view, a process window is a region in a vector space spanned by all the processing parameters. In a given patterning process, the process window of a pattern is dictated by the specifications of the pattern and the physics involved in the patterning process.

Using a region in a vector space spanned by all the processing parameters as the process window may not be convenient. A region of a subspace (i.e., a space spanned by fewer than all the processing parameters) ("sub-PW") may be used instead of the region the space spanned by all the processing parameters ("full PW"). For example, in a patterning process with many processing parameters, a region of the subspace spanned by focus and dose may be used as a sub-PW.

Processing parameters are parameters of the patterning process. The patterning process may include processes upstream and downstream to the actual exposure. Processing parameters may belong to a number of categories. A first category may be parameters of the lithography apparatus or any other apparatuses used in the patterning process. Examples of this category include parameters of the illumination system, projection system, substrate stage, etc. of a lithography apparatus. A second category may be parameters of any procedures performed in the patterning process. Examples of this category include focus, dose, bandwidth, exposure duration, development temperature, chemical compositions used in development, etc. A third category may be parameters of the design layout. Examples of this category may include shapes and/or locations of assist features, and/or adjustments applied by a resolution enhancement technique (RET). A fourth category may be parameters of the substrate. Examples include characteristics of structures under a resist layer, chemical composition of the resist layer, and/or physical dimensions of the resist layer. A fifth category may be parameters that represent a characteristic of temporal variation of one or more parameters of the patterning process. Examples of this category may include a characteristic of high frequency stage movements (e.g., frequency, amplitude, etc.), a high frequency laser bandwidth change (e.g., frequency, amplitude, etc.) and/or a high frequency laser wavelength change. These high frequency changes or movements are those above the response time of a mechanism to adjust the underlying parameter (e.g., stage position, laser intensity, etc.). A sixth category may be a characteristic upstream or downstream to exposure, such as post-exposure bake (PEB), development, etching, deposition, resist application, doping and/or packaging.

Various patterns in the design layout may have different process windows. Examples of pattern specifications that relate to potential systematic defects include checks for CD, necking, line pull back, line thinning, edge placement, overlapping, resist top loss, resist undercut and/or bridging. The process window of all the patterns in the design layout or a portion thereof may be obtained by merging (e.g., overlapping) process windows of each individual pattern.

Figure 3A:
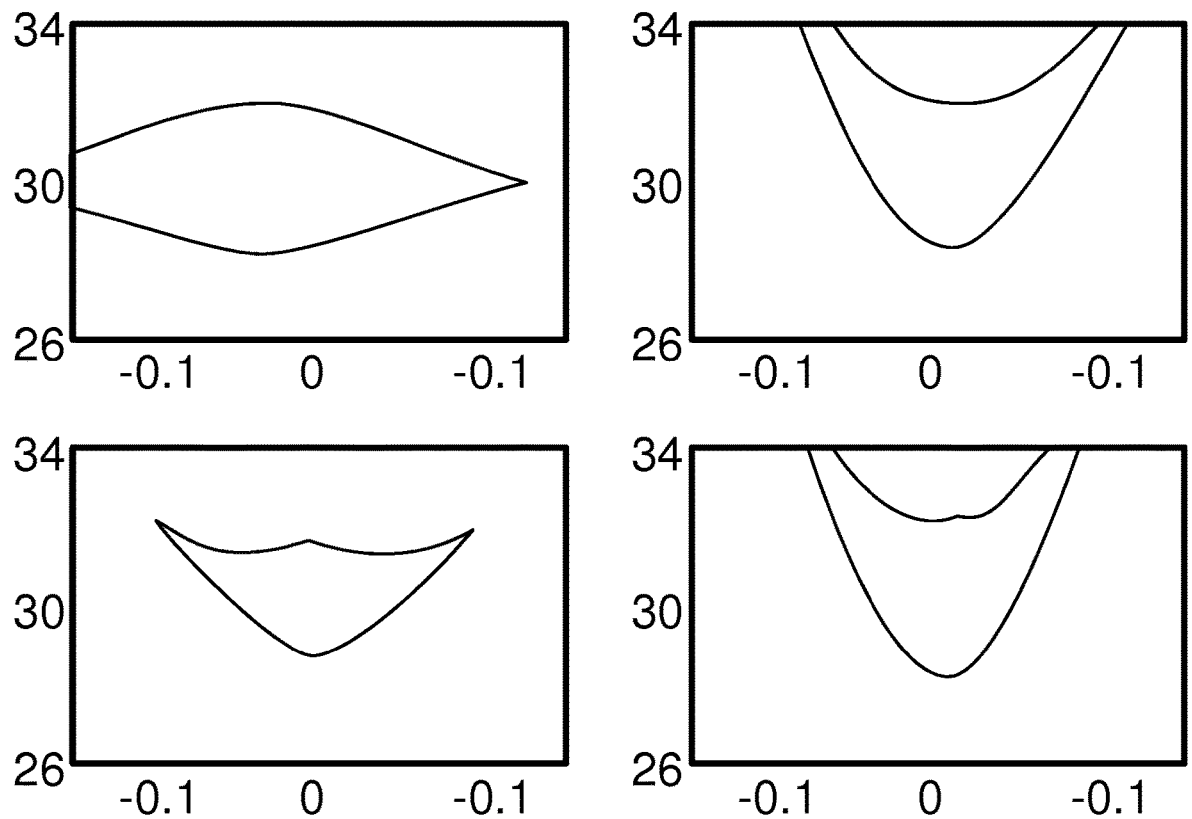
FIG. 3A shows sub-process windows spanned by focus (horizontal axis) and dose (vertical axis), for EPE (EPE-PWs) of each of four patterns.
Figure 3B:
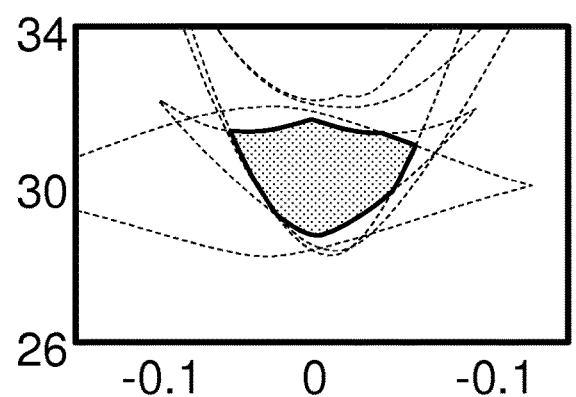
FIG. 3B shows a sub-process window (represented by the dot-hatched area), spanned by focus (horizontal axis) and dose (vertical axis), of EPE (EPE-OPW) of the four patterns.

In an example, when the specification of a pattern only dictates the edge placement error (EPE) of the pattern, the process window of the pattern may be called an EPE process window (EPE-PW). When the specification of a pattern only dictates the EPEs of a group of patterns, the overlapping process window of the group of patterns may be called an EPE overlapping process window (EPE-OPW). An EPE-PW or EPE-OPW may have sub-PWs. FIG. 3A shows sub-PWs, spanned by focus (horizontal axis) and dose (vertical axis), of EPE (EPE-PWs) of each of four patterns. FIG. 3B shows a sub-PW (represented by the dot-hatched area), spanned by focus (horizontal axis) and dose (vertical axis), of EPE (EPE-OPW) of the four patterns. Thus, the EPE-OPW is the overlapping area of the EPE-PWs of the four patterns. The sub-PWs are under a condition of a quadrupole illumination (sometimes known as "quasar illumination").

As stated above, a cost function may be used in an optimization or configuration process of a system. The cost function may represent one or more figures of merit of the system. A figure of merit of the system may be called a metric of the system. The optimization process finds a set of parameters of the system that optimizes (e.g., minimizes or maximizes) the cost function, under a certain constraint if any. When the cost function is optimized (e.g., minimized or maximized), the one or more figures of merit represented by the cost function are optimized (e.g., minimized or maximized). In a lithography apparatus, as an example, a cost function may be expressed as $$CF(z_1, z_2, \ldots, z_N) = \sum_{p=1}^{P} w_p f_p^2(z_1, z_2, \ldots, z_N) \tag{Eq. 1}$$

wherein $(z_1, z_2, \ldots, z_N)$ are N design variables or values thereof. $f_p(z_1, z_2, \ldots, z_N)$ can be a figure of merit that is a function of the design variables $(z_1, z_2, \ldots, z_N)$, such as a difference between an actual value and an intended value of a characteristic for a set of values of the design variables of $(z_1, z_2, \ldots, z_N)$. For example, $f_p(z_1, z_2, \ldots, z_N)$ may be a metric characterizing the size of a process window (e.g., EPE-PW). $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. Of course, $CF(z_1, z_2, \ldots, z_N)$ is not limited to the form in Eq. 1. $CF(z_1, z_2, \ldots, z_N)$ can be in any other suitable form.

The cost function may represent any one or more suitable characteristics of the lithography apparatus, patterning process or the substrate, for instance, edge placement error, CD, image shift, image distortion, image rotation, stochastic variation, throughput, local CD variation, or a combination thereof. In one embodiment, the design variables $(z_1, z_2, \ldots, z_N)$ comprise one or more selected from dose, focus, global bias of the patterning device, and/or shape of illumination. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$). The design variables can include any adjustable parameter such as an adjustable parameter of the illumination system, the patterning device, the projection system, dose, focus, etc.

The lithographic apparatus may include components collectively called a "wavefront manipulator" that can be used to adjust the shape of a wavefront and intensity distribution and/or phase shift of a radiation beam. In an embodiment, the lithographic apparatus can adjust a wavefront and intensity distribution at any location along an optical path of the lithography apparatus, such as before the patterning device, near a pupil plane, near an image plane, and/or near a focal plane. The wavefront manipulator can be used to correct or compensate for one or more certain distortions of the wavefront and intensity distribution and/or phase shift caused by, for example, the illumination system, the patterning device, temperature variation in the lithography apparatus, thermal expansion of a component of the lithography apparatus, etc. Adjusting the wavefront and intensity distribution and/or phase shift can change values of one or more characteristics represented by the cost function. Such a change can be simulated from a model or actually measured. The design variables can include a parameter of the wavefront manipulator.

The design variables may have constraints, which can be expressed as $(z_1, z_2, \ldots, z_N) \in Z$, where Z is a set of possible values of the design variables. One possible constraint on the design variables may be imposed by a desired throughput of the lithography apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

Figure 4A:
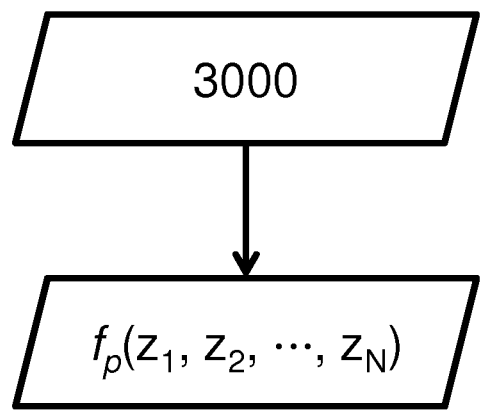
FIG. 4A schematically shows that the $f_p(z_1, z_2, \ldots, z_N)$ is affected by optical aberration 3000 of the lithography apparatus.

The cost function may be repeatedly computed during the optimization process. Computing the cost function may include computing the $f_p(z_1, z_2, \ldots, z_N)$. The $f_p(z_1, z_2, \ldots, z_N)$ may be affected by optical aberrations in the lithography apparatus. For example, when $f_p(z_1, z_2, \ldots, z_N)$ relates to an image formed in the patterning process, aberrations in the lithography apparatus used to form the image can affect the image and hence the $f_p(z_1, z_2, \ldots, z_N)$. A non-exhaustive list of examples of the $f_p(z_1, z_2, \ldots, z_N)$ that relate to an image includes one or more EPEs and functions thereof, a process window or a metric characterizing a process window, yield, a stochastic effect, presence or probability of defects, and/or an inter-layer characteristic (i.e., a characteristic of a structure relative to another structure when these structures are in different layers). FIG. 4A schematically shows that the $f_p(z_1, z_2, \ldots, z_N)$ is affected by optical aberration 3000 of the lithography apparatus. Computation of the $f_p(z_1, z_2, \ldots, z_N)$ and hence the cost function taking into account of the impact by the optical aberration can be difficult or expensive, especially when the cost function is repeatedly computed during the optimization or when the cost function represents multiple $f_p(z_1, z_2, \ldots, z_N)$ affected by the optical aberration.

Figure 4B:
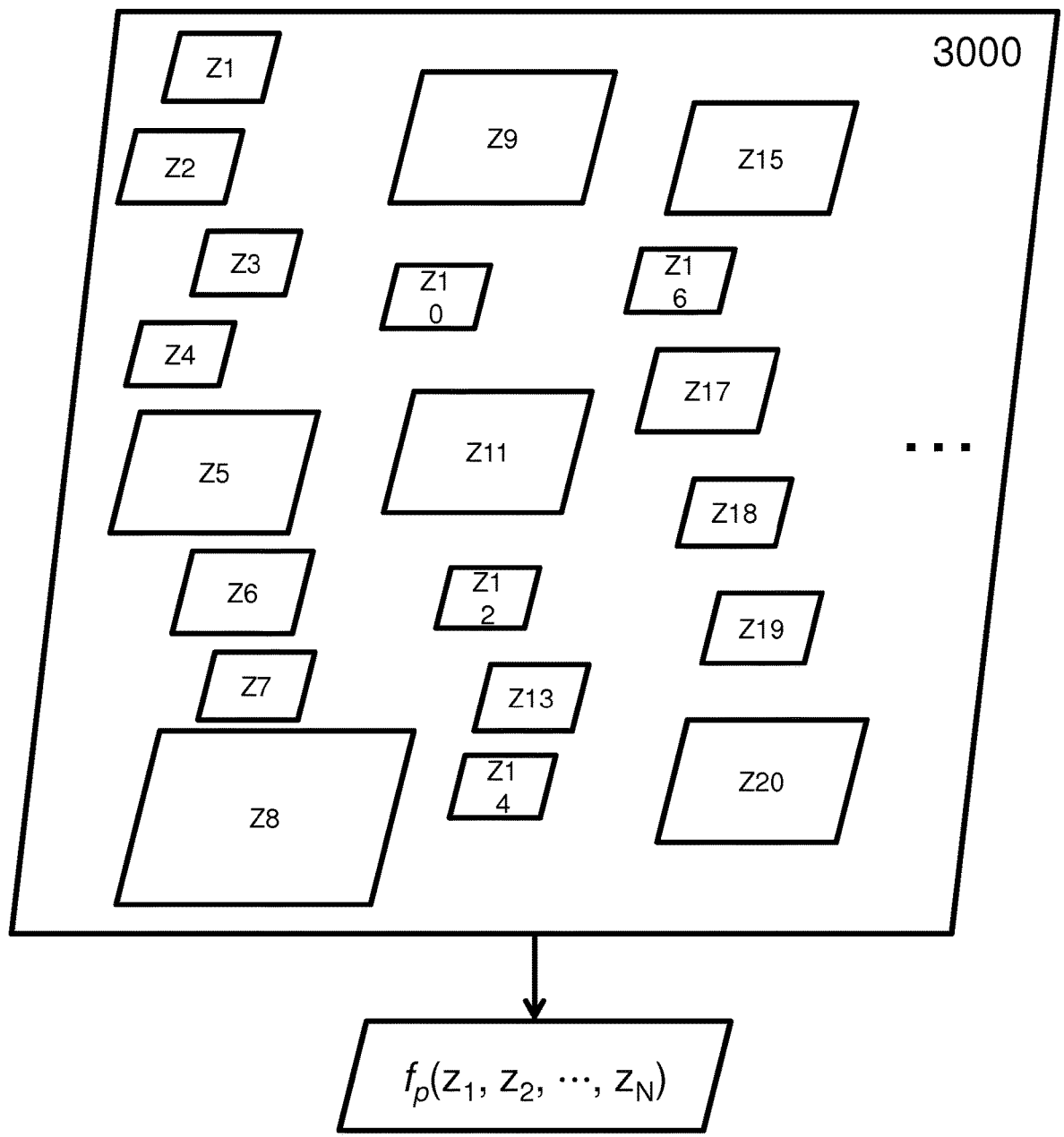
FIG. 4B schematically shows that the optical aberration may be decomposed into multiple components.

FIG. 4B schematically shows that the optical aberration may be decomposed into multiple components. For example, the optical aberration may be decomposed into multiple Zernike coefficients. This decomposition process is called a Zernike transform. The basis functions of the Zernike transform are Zernike polynomials. Not every component of the optical aberration has equal impact on the $f_p(z_1, z_2, \ldots, z_N)$. The sizes of the parallelograms associated with the Zernike coefficients (Z1, Z2, . . . , Z20, . . . ) schematically represent the magnitudes of the impact the components of the aberration corresponding to the Zernike coefficients respectively have on $f_p(z_1, z_2, \ldots, z_N)$.

Figure 4C:
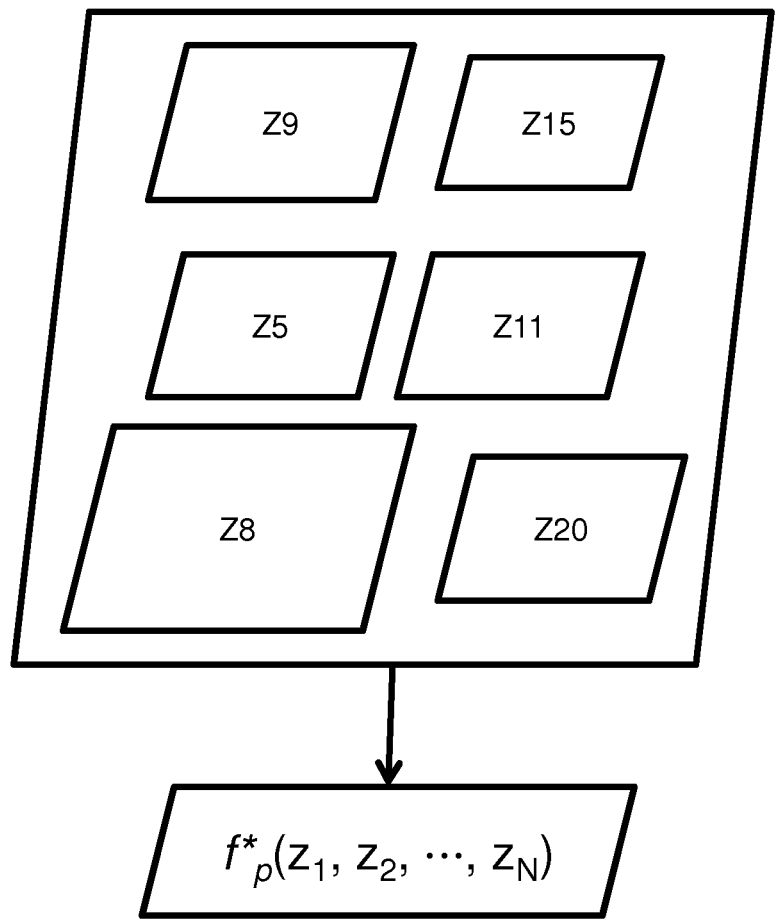
FIG. 4C schematically shows that only some of the components of the optical aberration may be selected to approximate the $f_p(z_1, z_2, \ldots, z_N)$.

FIG. 4C schematically shows that only some of the components of the optical aberration may be selected to approximate the $f_p(z_1, z_2, \ldots, z_N)$. Namely, only the impact of these selected components on the $f_p(z_1, z_2, \ldots, z_N)$ are taken into account when computing an approximate $f_p^*(z_1, z_2, \ldots, z_N)$ of the $f_p(z_1, z_2, \ldots, z_N)$. For example, only 3 or less, 4 or less, 5 or less, 6 or less, 7 or less, 8 or less, 9 or less or 10 or less components. The cost function may be then approximated using $f_p^*(z_1, z_2, \ldots, z_N)$ instead of $f_p(z_1, z_2, \ldots, z_N)$. For example, the cost function in Eq. 1 can be approximated as $CF^*(z_1, z_2, \ldots, z_N) = \Sigma_{p=1}^{P} w_p (f_p^*(z_1, z_2, \ldots, z_N))^2$. The selected components of the optical aberration may be those that have greater impact on $f_p(z_1, z_2, \ldots, z_N)$ than the other components. In the example of FIG. 4C, only six Zernike coefficients (Z5, Z8, Z9, Z11, Z15 and Z20) are selected to compute the approximate $f_p^*(z_1, z_2, \ldots, z_N)$. In an embodiment, some or all of the components of the optical aberration are among the design variables $(z_1, z_2, \ldots, z_N)$. In an embodiment, some or all of the components of the optical aberration are functions of the design variables. In an embodiment, some or all of the components of the optical aberration are not adjustable by changing the values of the design variables $(z_1, z_2, \ldots, z_N)$.

Figure 5:
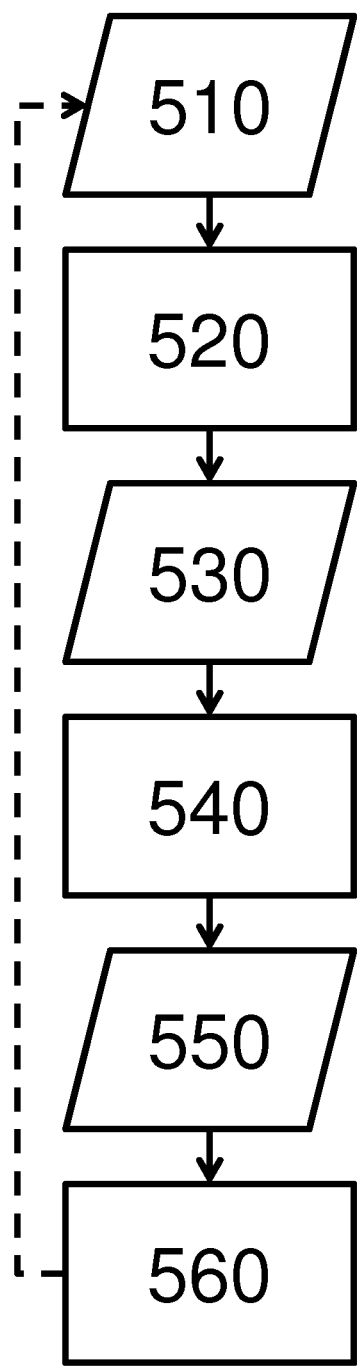
FIG. 5 schematically shows a flow chart of a method of optimizing or configuring a lithography apparatus or a patterning process using the lithography apparatus, based on one or more selected aberrations, according to an embodiment.

FIG. 5 schematically shows a flow chart for an embodiment of a method of optimizing or configuring a lithography apparatus or a patterning process using the lithography apparatus, based on one or more selected aberrations, according to an embodiment. In procedure 520, one or more selected components 530 of the optical aberration of the lithography apparatus are obtained under a processing condition 510. The processing condition 510 may include one or more conditions of the illumination system, the patterning device, the projection system or a combination selected therefrom. The processing condition 510 may be represented by the design variables $(z_1, z_2, \ldots, z_N)$. The processing condition 510 may be obtained by optimizing the lithography apparatus or the patterning process without considering any optical aberration. The one or more selected components 530 may be represented by Zernike coefficients. Obtaining the selected components 530 may be based on a sensitivity of a $f_p(z_1, z_2, \ldots, z_N)$ with respect to a component of the optical aberration. For example, the one or more selected components 530 may be those one or more components for which the respective sensitivity of a $f_p(z_1, z_2, \ldots, z_N)$ to that respective component is higher than that with respect to one or more of the other components. For example, the one or more selected components 530 may be those one or more components with a sensitivity of a $f_p(z_1, z_2, \ldots, z_N)$ to the respective component above a threshold. In procedure 540, an approximate 550 of the cost function is computed based on the one or more selected components 530 but not the other components of the optical aberration. In procedure 560, the lithography apparatus or patterning process is adjusted (e.g., optimized) based on the approximate 550 of the cost function. In an embodiment, the design variables include one or more variables of the illumination system, one or more variables the patterning device, one or more variables the projection system or a combination selected therefrom. In an embodiment, the design variables include one or more variables of the illumination system and one or more variables the patterning device. In an embodiment, the adjustment produces new values of the design variables and the procedures 520 and 540 may be repeated under a processing condition represented by the new values of the design variables.

Figure 6:
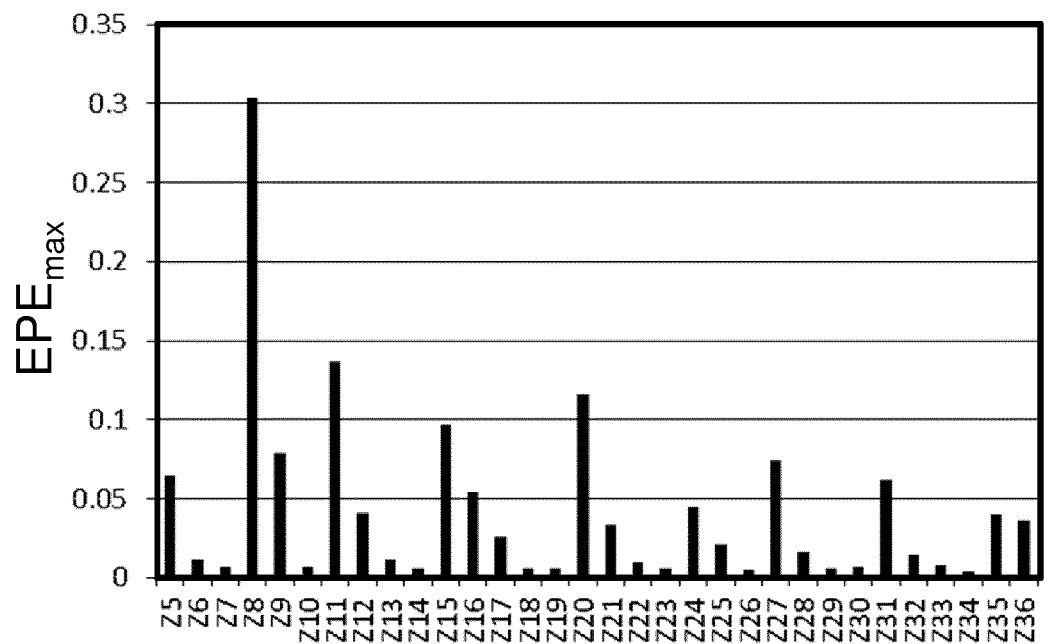
FIG. 6 shows an example, where the largest magnitude of EPE ("$EPE_{max}$") in a group of patterns caused by a few components of the optical aberration respectively are plotted.

In an example shown in FIG. 6, the largest magnitude of EPE ("$EPE_{max}$") in a group of patterns caused respectively by a component of optical aberration is plotted for each of a few components of optical aberration. The components are represented by Zernike coefficients in this example. The higher the $EPE_{max}$ of a component of optical aberration, the more impact that component has on the group of patterns. In this example, Z5, Z8, Z9, Z11, Z15, Z20, Z27 and Z31 may be selected in procedure 520 of FIG. 5 because these components of the optical aberration have higher impact on the group of patterns than the other components. That is, the EPE is more sensitive with respect to each of Z5, Z8, Z9, Z11, Z15, Z20, Z27 and Z31 than the other components of aberration. In an embodiment, in addition to or as an alternative to maximum values, the average value of the characteristic, the root mean square, root mean 2n-th power, where n is a positive integer, etc. could be used.

Figure 7:
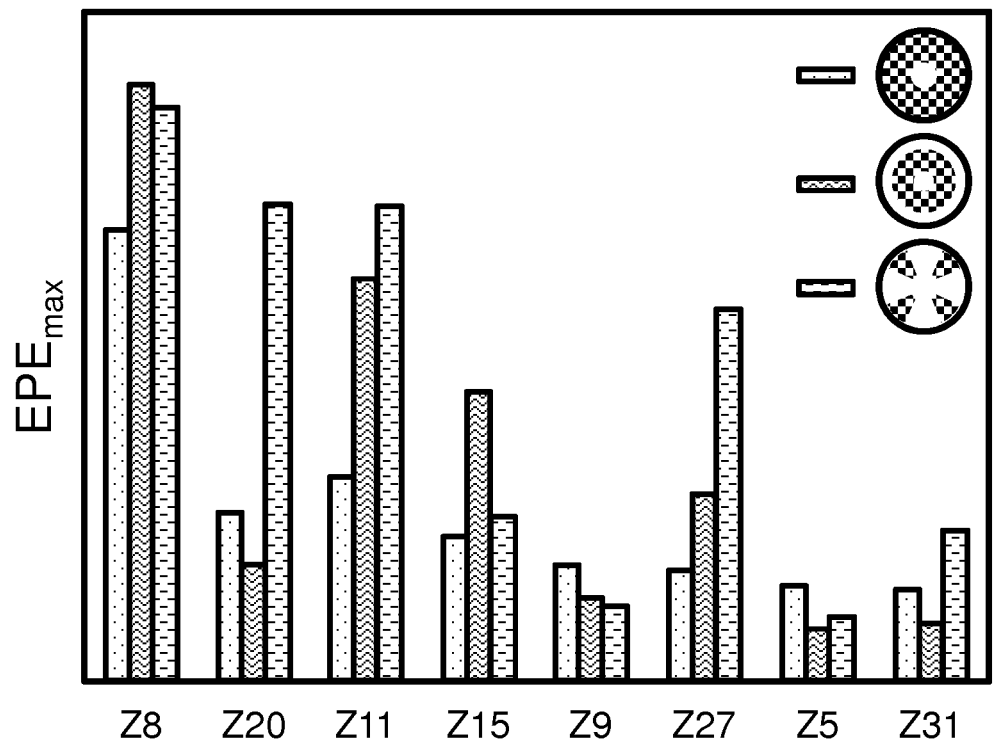
FIG. 7 shows that the impact of the components of the optical aberration can depend on the illumination.

FIG. 7 shows that the impact of the components of the optical aberration can depend on the processing condition. For example, the $EPE_{max}$ in the group of patterns in FIG. 6 of the selected components Z5, Z8, Z9, Z11, Z15, Z20, Z27 and Z31 can depend on an illumination characteristic, such as the spatial or angular intensity distribution of the illumination (e.g., a modified conventional illumination (the top picture at the right hand side), an annular illumination (the middle picture at the right hand side), and quasar illumination (the bottom picture at the right hand side). Therefore, reselecting the one or more components during the process may be useful because a change in the processing condition (e.g., change in illumination) during the method may cause the magnitude of the impact of the one or more components to change.

In an example, the metric of the approximate $f_p^*(z_1, z_2, \ldots, z_N)$ (or of $f_p(z_1, z_2, \ldots, z_N)$) may be computed as follows. For each selected component of optical aberration (which can be the same set as described above or a different set), the largest value of a characteristic (e.g., EPE) in a group of patterns caused by that selected component is determined. In an embodiment, the largest value is determined at best focus and/or dose. In an embodiment, for each selected component, the largest magnitude of a change of a characteristic (e.g., pattern characteristic such as edge placement (EP)) in a group of patterns caused by a same amount of that selected component is determined. In an embodiment, in addition to or as an alternative to maximum values, the average EPE, the root mean square, root mean 2n-th power, where n is a positive integer, etc. could be used. In an embodiment, the metric of the approximate $f_p^*(z_1, z_2, \ldots, z_N)$ is the average of the largest values of the characteristic (e.g., EPE) caused by all the selected components. In an embodiment, mathematically, $f_p^*(z_1, z_2, \ldots, z_N)$ may be expressed as $\text{avg}_{z \in C}[\max_{i \in G}(M_i|_z)]$, where $M_i|_z$ is the characteristic M (e.g., edge placement error (EPE)) of the i-th pattern caused by the amount of the selected component Z, C is a set consisting of the selected components, and G is a set consisting of the group of patterns. In an embodiment, in addition to or as an alternative to an average, the root mean square, root mean 2n-th power, where n is a positive integer, etc. could be used. In an embodiment, the metric is minimized (e.g., where the metric represents EPE) in evaluating the cost function. This metric is referred to herein for convenience as the aberration metric.

Figure 8:
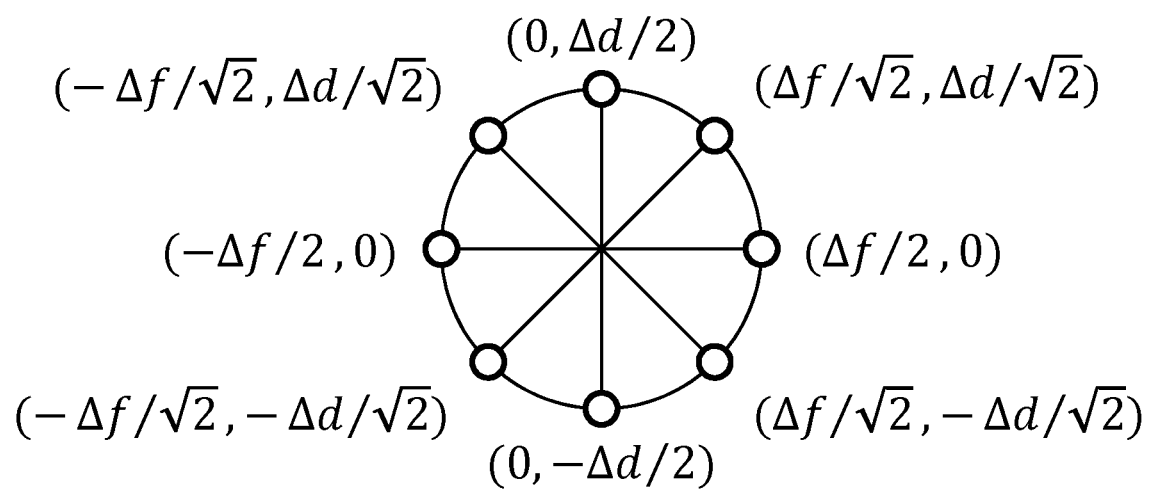
FIG. 8 schematically shows an embodiment of a metric that can be used to characterize a process window (e.g., a sub-PW spanned by focus and dose).

FIG. 8 schematically shows a further example metric $f_p(z_1, z_2, \ldots, z_N)$ that characterizes a process window (e.g., a sub-PW spanned by focus and dose, or a sub-PW spanned by mask error enhancement factor (MEEF) and flare). This metric is referred to herein for convenience as the process window metric. The metric can be used as the approximate $f_p^*(z_1, z_2, \ldots, z_N)$. Using the sub-PW spanned by focus and dose as an example (i.e., N=2, $z_1$ is focus, $z_2$ is dose), at each of eight offsets from the nominal focus and dose, $(0, \Delta d/2)$, $(\Delta f/\sqrt{2}, \Delta d/\sqrt{2})$, $(\Delta f/2, 0)$, $(\Delta f/\sqrt{2}, -\Delta d/\sqrt{2})$, $(0, -\Delta d/2)$, $(-\Delta f/\sqrt{2}, -\Delta d/\sqrt{2})$, $(-\Delta f/2, 0)$, and $(-\Delta f/\sqrt{2}, \Delta d/\sqrt{2})$, the largest values of a characteristic (e.g., EPE) in a group of patterns relative to the characteristic at the nominal focus and dose is determined. In an embodiment, in addition to or as an alternative to maximum values, the average EPE, the root mean square, root mean 2n-th power, where n is a positive integer, etc. could be used. $\Delta f$ is the latitude in focus (e.g., +−40 nm of best focus) and $\Delta d$ is the latitude in dose (e.g., +−10% of the nominal dose). In this example, the $f_p(z_1, z_2, \ldots, z_N)$ is the average of all these offsets. In an embodiment, in addition to or as an alternative to an average value, the root mean square, root mean 2n-th power, where n is a positive integer, etc. could be used. This metric $f_p(z_1, z_2, \ldots, z_N)$ is certainly applicable to a process window spanned by N design variables $(z_1, z_2, \ldots, z_N)$. In an embodiment, mathematically, the $f_p(z_1, z_2, \ldots, z_N)$ may be expressed as $\text{avg}_{s \in O}[\max_{i \in G}(M_i|_s)]$, where $M_i|_s$ is the value of the characteristic of the i-th pattern at the applicable offset s, O is a set consisting of the offsets, and G is a set consisting of the group of patterns. In an example, $$O = \left\{ \left(\frac{z_1}{2}, 0, 0, 0, \ldots\right), \left(0, \frac{z_2}{2}, 0, 0, \ldots\right), \left(0, 0, \frac{z_3}{2}, 0, \ldots\right), \left(0, 0, 0, \ldots, \frac{z_N}{2}\right) \right\} \cup \bigcup_{p \neq q} \left\{ \left(0, 0, \ldots, \frac{z_p}{\sqrt{2}}, \ldots, \frac{z_q}{\sqrt{2}}, \ldots, 0\right) \right\}.$$

Figure 9:
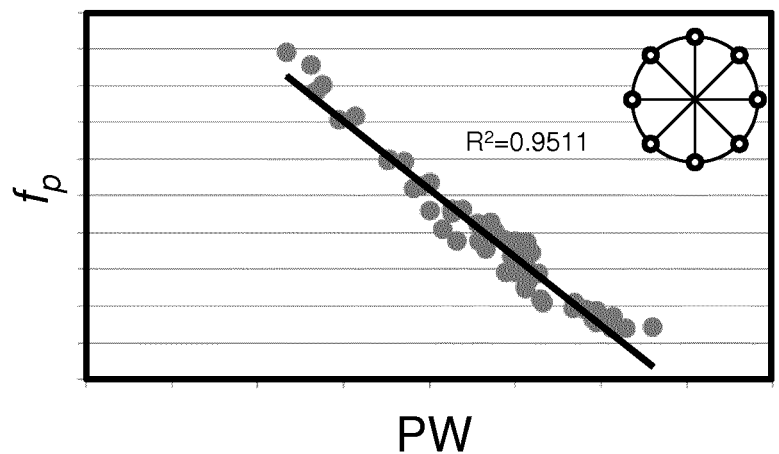
FIG. 9 shows that the metric illustrated in FIG. 8 has a good correlation with the size of the process window.

FIG. 9 shows that the metric illustrated in FIG. 8 has a good correlation with the size of the process window. Other linear combinations of the processing parameters spanning the sub-PW may be used to form the metric $f_p(z_1, z_2, \ldots, z_N)$.

In an embodiment, the metric is minimized (e.g., where the metric represents EPE) in evaluating the cost function.

In an embodiment, the metric of $f_p^*(z_1, z_2, \ldots, z_N)$ or of $f_p(z_1, z_2, \ldots, z_N)$ is a combination of metric, such as a combination of the process window metric and the aberration metric. In an embodiment, the metric is the process window metric added to the aberration metric. In an embodiment, the metric is the process window metric added to a weighting of the aberration metric. In an embodiment, the weighting can be changed during the configuring/optimization process.

With the cost function defined and its computation method obtained, the process proceeds, in an embodiment, to find a set of values of the one or more design variables, under the constraints $(z_1, z_2, \ldots, z_N) \in Z$, that optimize the cost function, e.g., to find:

$$(\tilde{z}_1, \tilde{z}_2, \ldots, \tilde{z}_N) = \arg\min_{(z_1, z_2, \ldots, z_N)} \quad \text{(Eq. 2)}$$

So, in an embodiment, there is provided methods and metrics for finding a solution (e.g., a source-mask optimization solution) which maximizes an overlapping edge placement error (EPE) process window for patterning (e.g., EUV patterning). That is, in an embodiment, the solution maximizes the size of the overlapping EPE process window, namely a process parameter space where a plurality of the parts of the pattern has an EPE better than a specification (e.g., within 5% of CD). In an embodiment, a solution found with an EPE minimization algorithm will a give near optimum overlapping EPE process window.

In an embodiment, it can be impractical to iteratively calculate the overlapping EPE process window within an optimization loop so a "shortcut metric" can be used which has strong correlation with the overlapping EPE process window and to use this in the optimization. In an embodiment, the metric comprises the process window metric described above. In an embodiment, it minimizes the maximum EPE (maximum amongst all user defined measurement cuts in the pattern) around a focus:dose variation space. Such an approach would be expected to maximize the overlapping EPE process window.

Further, optimized processes can be noticeably degraded when the actual lithography apparatus optical aberrations are included. This is because the main effect of aberrations is to shift feature placement and since the amount of shift varies (with the aberrations) within the pattern and across the lithography apparatus exposure slit, the overlapping EPE process window through the slit is reduced. The amount of degradation depends on the specific optical aberrations. Further, the amount of degradation depends on other parameters, such as illumination parameters (e.g., intensity distribution), pattern parameters, etc. So it's desirable to find one or more parameters, such as an illumination parameter (e.g., intensity distribution) and/or a patterning parameter (e.g., OPC such as a scattering feature), which minimize EPE due to aberration effects. In an embodiment, the process further minimizes EPE due to the aforementioned focus and dose variation. So, in an embodiment, the optical aberration components (e.g., represented by Zernike polynomials) that induce the greatest EPE for the pattern of interest are identified. The subset of optical aberrations components with such highest sensitivity are selected for use in the optimization.

In an embodiment, a maximum EPE (maximum amongst all the user defined measurement cuts in the pattern) for each of the "high sensitivity" optical aberration components (e.g., represented by Zernike coefficients) is identified and combined into the aberration metric as described above. A total metric may then be used in the optimization as a sum of the process window metric and the aberration metric (e.g., weighted).

As a result, the method can produce an illumination mode and/or pattern with less aberration sensitivity and optimum overlapping EPE process window through the exposure slit in the presence of actual optical aberrations.

Figure 10:
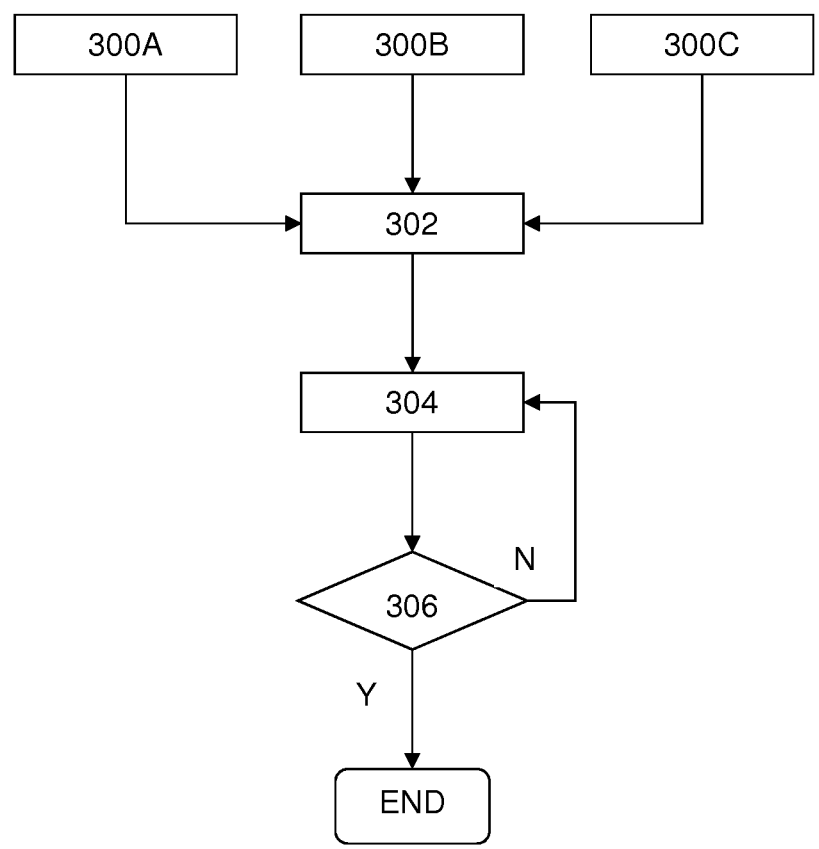
FIG. 10 is a flow diagram illustrating aspects of an example methodology of joint optimization/co-optimization.

A general method of optimizing, according to an embodiment, is illustrated in FIG. 10. This method comprises a step 302 of defining a multi-variable cost function of a plurality of design variables. The design variables may comprise any suitable combination selected from design variables representing one or more characteristics of the illumination (300A) (e.g., pupil fill ratio, namely percentage of radiation of the illumination that passes through a pupil or aperture), one or more characteristics of the projection system (300B) and/or one or more characteristics of the design layout (300C). For example, the design variables may include design variables representing one or more characteristics of the illumination (300A) and of the design layout (300C) (e.g., global bias) but not of one or more characteristics of the projection system (300B), which leads to an illumination-patterning device (e.g., mask) optimization ("source-mask optimization" or SMO). Or, the design variables may include design variables representing one or more characteristics of the illumination (300A) (optionally polarization), of the projection system (300B) and of the design layout (300C), which leads to an illumination-patterning device (e.g., mask)-projection system (e.g., lens) optimization ("source-mask-lens optimization" or SMLO). In step 304, the design variables are simultaneously adjusted so that the cost function is moved towards convergence. In step 306, it is determined whether a predefined termination condition is satisfied. The predetermined termination condition may include various possibilities, e.g., one or more selected from: the cost function is minimized or maximized, as required by the numerical technique used, the value of the cost function is equal to a threshold value or crosses the threshold value, the value of the cost function reaches within a preset error limit, and/or a preset number of iterations is reached. If a condition in step 306 is satisfied, the method ends. If the one or more conditions in step 306 is not satisfied, the steps 304 and 306 are iteratively repeated until a desired result is obtained. The optimization does not necessarily lead to a single set of values for the one or more design variables because there may be a physical restraint, caused by a factor such as pupil fill factor, resist chemistry, throughput, etc. The optimization may provide multiple sets of values for the one or more design variables and associated performance characteristics (e.g., the throughput) and allows a user of the lithographic apparatus to pick one or more sets.

The illumination, patterning device and projection system can be optimized alternately (referred to as Alternate Optimization) or optimized simultaneously (referred to as Simultaneous Optimization). Patterns on multiple layers of the design layout may be optimized simultaneously or alternately. The terms "simultaneous", "simultaneously", "joint" and "jointly" as used herein mean that the one or more design variables representing one or more characteristics of the illumination, patterning device, projection system and/or any other design variable, are allowed to change at the same time. The term "alternate" and "alternately" as used herein mean that not all of the design variables are allowed to change at the same time.

Figure 11:
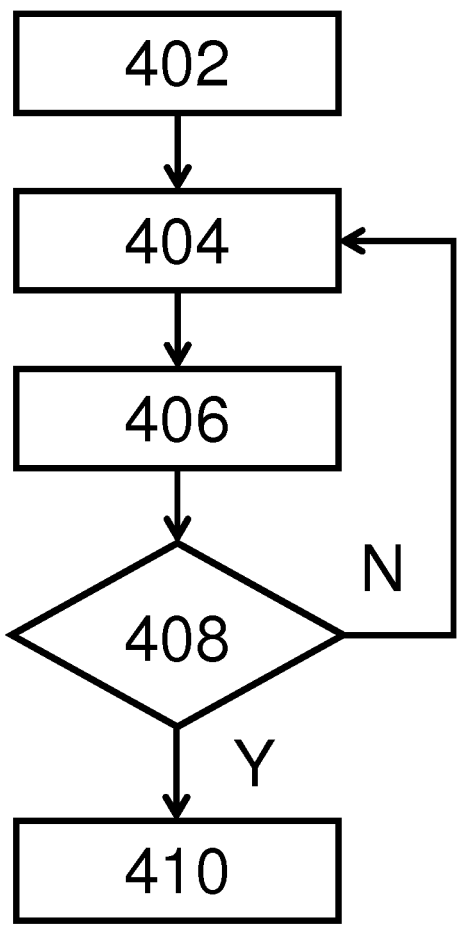
FIG. 11 shows an embodiment of a further optimization method, according to an embodiment.

In FIG. 10, the optimization of all the design variables is executed simultaneously. Such a flow may be called simultaneous flow or co-optimization flow. Alternately, the optimization of all the design variables is executed alternately, as illustrated in FIG. 11. In this flow, in each step, some design variables are fixed while other design variables are optimized to optimize the cost function; then in the next step, a different set of variables are fixed while the others are optimized to minimize or maximize the cost function. These steps are executed alternately until convergence or a certain terminating condition is met. As shown in the non-limiting example flowchart of FIG. 11, first, a design layout (step 402) is obtained, then a step of illumination optimization is executed in step 404, where the one or more design variables of the illumination are optimized (SO) using the cost function while other design variables are fixed. Then in the next step 406, a patterning device (e.g., mask) optimization (MO) is performed, where the design variables of the patterning device are optimized using the cost function while other design variables are fixed. These two steps are executed alternately, until a certain terminating condition is met in step 408. One or more various termination conditions can be used, such as the value of the cost function becomes equal to a threshold value, the value of the cost function crosses the threshold value, the value of the cost function reaches within a preset error limit, a preset number of iterations is reached, etc. Note that SO-MO-Alternative-Optimization is used as an example for the alternative flow. The alternative flow can take many different forms, such as SO-LO-MO-Alternative-Optimization, where SO, LO (projection system optimization) is executed, and MO alternately and iteratively; or first SMO can be executed once, then execute LO and MO alternately and iteratively; and so on. Another alternative is SO-PO-MO (illumination optimization, polarization optimization and patterning device optimization) Finally output of the process result is obtained in step 410, and the process stops.

Figure 12A:
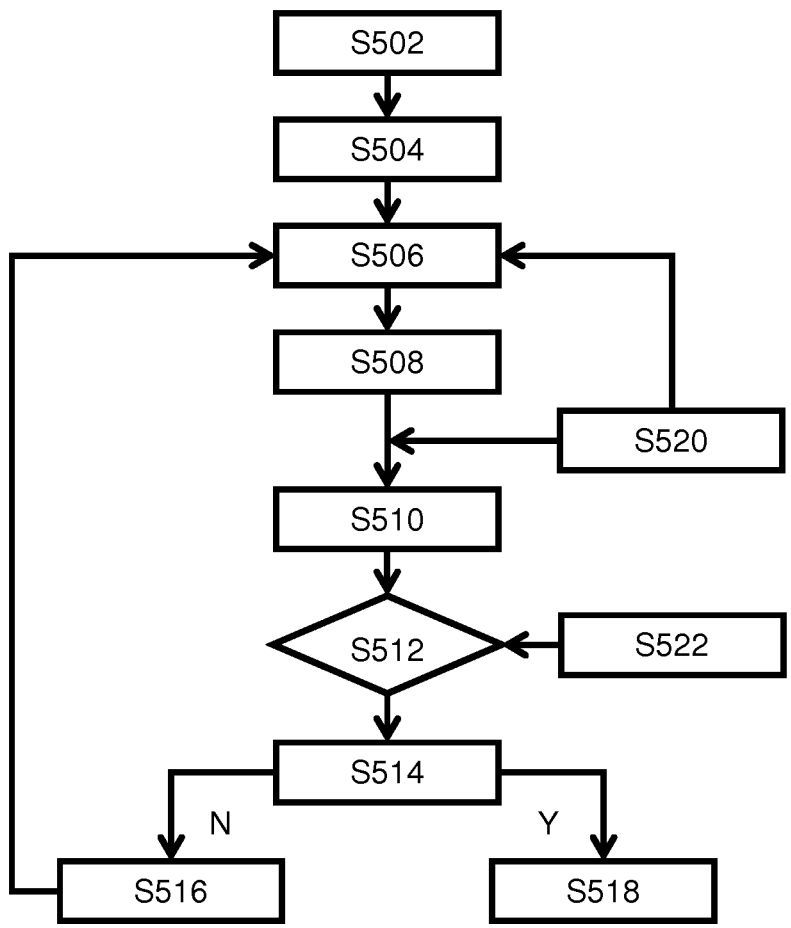
FIG. 12A, FIG. 12B and FIG. 13 show example flowcharts of various optimization processes.

FIG. 12A shows one exemplary method of optimization, where a cost function representing one or more characteristics of the patterning process is minimized or maximized. In step S502, initial values of one or more design variables are obtained, including one or more associated tuning ranges, if any. In step S504, the multi-variable cost function is set up. In step S506, the cost function is expanded within a small enough neighborhood around the starting point value of the one or more design variables for the first iterative step (i=0). In step S508, standard multi-variable optimization techniques are applied to the cost function. Note that the optimization problem can apply constraints, such as the one or more tuning ranges, during the optimization process in S508 or at a later stage in the optimization process. Step S520 indicates that each iteration is done for the one or more given test patterns (also known as "gauges") for the characteristics the cost function represents. In step S510, a lithographic response (e.g., EPE or a parameter based on EPE such as the metric described above) is predicted. In step S512, the result of step S510 is compared with a desired or ideal lithographic response value obtained in step S522. If the termination condition is satisfied in step S514, i.e. the optimization generates a lithographic response value sufficiently close to the desired value, then the final value of the design variables is outputted in step S518. The output step may also include outputting one or more other functions using the final values of the design variables, such as outputting a wavefront aberration-adjusted map at the pupil plane (or other planes), an optimized illumination map, and/or optimized design layout etc. If the termination condition is not satisfied, then in step S516, the values of the one or more design variables is updated with the result of the i-th iteration, and the process goes back to step S506. The process of FIG. 12A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n},$$

(n=1, 2, ... N) exist), which is generally valid in a lithography apparatus. An algorithm, such as discrete optimization (e.g., "downhill" discrete optimization by pixel flipping), the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} (z_n = z_{ni}) \qquad (Eq. 3)$$

Under the approximation of Eq. 3, the cost function becomes:

$$CF(z_1, z_2, \ldots, z_N) = \qquad (Eq. 4)$$
$$\sum_{p=1}^{P} w_p f_p^2(z_1, z_2, \ldots, z_N) = \sum_{p=1}^{P} w_p \bigg( f_p(z_{1i}, z_{2i}, \ldots, z_{ni}) + \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} (z_n = z_{ni}) \bigg)^2$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving N linear equations:

$$\frac{\partial CF(z_1, z_2, \ldots, z_N)}{\partial z_n} = 0,$$

wherein n=1, 2, ..., N.

If the design variables $(z_1, z_2, \ldots, z_N)$ are under constraints in the form of J inequalities (e.g. tuning ranges of $(z_1, z_2, \ldots, z_N)$) $\sum_{n=1}^{N} A_{nj} z_n \leq B_j$, for $j=1, 2, \ldots, J$; and K equalities (e.g. interdependence between the design variables) $\sum_{n=1}^{N} C_{nk} z_n \leq D_k$, for $k=1, 2, \ldots, K$, the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$, can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \leq z_n \leq z_{ni} + \Delta_D$. $(z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin N.Y.: Vandenberghe. Cambridge University Press).

Instead of minimizing the RMS (or root mean 2n-th power, where n is a positive integer) of $f_p(z_1, z_2, \ldots, z_N)$, the optimization process can minimize magnitude of the largest deviation (the worst defect) among the characteristics to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p} \quad \text{(Eq. 5)}$$

wherein $CL_p$ is the maximum allowed value for $f_p(z_1, z_2, \ldots, z_N)$. This cost function represents the worst defect among the characteristics. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} w_p \left( \frac{f_p(z_1, z_2, \ldots, z_N)}{CL_p} \right)^q \quad \text{(Eq. 6)}$$

wherein q is an even positive integer (e.g., at least 4, or at least 10). Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$ are two constants specifying the minimum and maximum allowed deviation for the $f_p(z_1, z_2, \ldots, z_N)$. Plugging Eq. 3 in, these constraints are transformed to, for $p=1, \ldots P$, $$\sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} \quad \text{(Eq. 6')}$$

$$z_n \leq E_{Up} + \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}}$$

$$z_{ni} - f_p(z_{1i}, z_{2i}, \ldots, z_{Ni}) \text{ and}$$

$$-\sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} \quad \text{(Eq. 6'')}$$

$$z_n \leq -E_{Up} - \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}}$$

$$z_{ni} + f_p(z_{1i}, z_{2i}, \ldots, z_{Ni})$$

Since Eq. 3 is generally valid only in the vicinity of $(z_1, z_2, \ldots, z_N)$, in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_1, z_2, \ldots, z_N)$, i. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th characteristic is the worst defect, $w_r$ can be increased in the (i+1)-th iteration so that the reduction of that characteristic's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = (1-\lambda) \sum_{p=1}^{P} w_p f_p^2(z_1, z_2, \ldots, z_N) + \quad \text{(Eq. 6''')}$$

$$\lambda \max_{1 \leq p \leq P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithography apparatus can expand the process window. A larger process window provides more flexibility in process design and chip design. The process window can be defined as, for example, a set of focus and dose values for which the resist image is within a certain limit of the design target of the resist image. Note that all the methods discussed here may also be extended to a generalized process window definition that can be established by different or additional base parameters than exposure dose and defocus. These may include, but are not limited to, optical settings such as NA, sigma, aberration, polarization, or an optical constant of the resist layer. For example, as described earlier, if the process window (PW) also comprises different patterning device pattern bias (mask bias), then the optimization includes the minimization of Mask Error Enhancement Factor (MEEF), which is defined as the ratio between the substrate edge placement error (EPE) and the induced patterning device pattern edge bias. The process window defined on focus and dose values only serve as an example in this disclosure.

A method of maximizing a process window using, for example, dose and focus as its parameters, according to an embodiment, is described below. In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \varepsilon)$:

$$CF(z_1, z_2, \ldots, z_N, f_0, \varepsilon_0) = \max_{(f,\varepsilon)=(f_0\pm\Delta f, \varepsilon_0\pm\varepsilon)} \max_p |f_p(z_1, z_2, \ldots, z_N, f, \varepsilon)| \quad \text{(Eq. 7)}$$

or $$CF(z_1, z_2, \ldots, z_N, f_0, \varepsilon_0) = \Sigma_{(f,\varepsilon)=(f_0\pm\Delta f, \varepsilon_0\pm\varepsilon)} \Sigma_p w_p f_p (z_1, z_2, \ldots, z_N, f, \varepsilon) \quad \text{(Eq. 7')}$$

or $$CF(z_1, z_2, \ldots, z_N, f_0, \varepsilon_0) = (1-\lambda)\Sigma_{(f,\varepsilon)=(f_0\pm\Delta f, \varepsilon_0\pm\varepsilon)} \Sigma_p w_p f_p^2 (z_1, z_2, \ldots, z_N, f, \varepsilon) + \lambda \max_{(f,\varepsilon)=(f_0\pm\Delta f, \varepsilon_0\pm\varepsilon)} \max_p |f_p(z_1, z_2, \ldots, z_N, f, \varepsilon)| \quad \text{(Eq. 7'')}$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N, f, \varepsilon)$ can be found such that the cost function is within a preset limit.

If the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \varepsilon)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 7, 7', or 7". If the design variables represent one or more characteristics of the projection system, such as the Zernike coefficients, then minimizing the cost functions of Eqs. 7, 7', or 7" leads to process window maximization based on projection system optimization, i.e., LO. If the design variables represent one or more characteristics of the illumination and patterning device in addition to those of the projection system, then minimizing the cost function of Eqs. 7, 7', or 7" leads to process window maximizing based on SMLO, as illustrated in FIG. 10. If the design variables represented one or more characteristics of the illumination and patterning device, then minimizing the cost functions of Eqs. 7, 7', or 7" leads to process window maximization based on SMO. The cost functions of Eqs. 7, 7', or 7" can also include at least one $f_p(z_1, z_2, \ldots, z_N)$ such as described herein, that is a function of the bandwidth.

Figure 13:
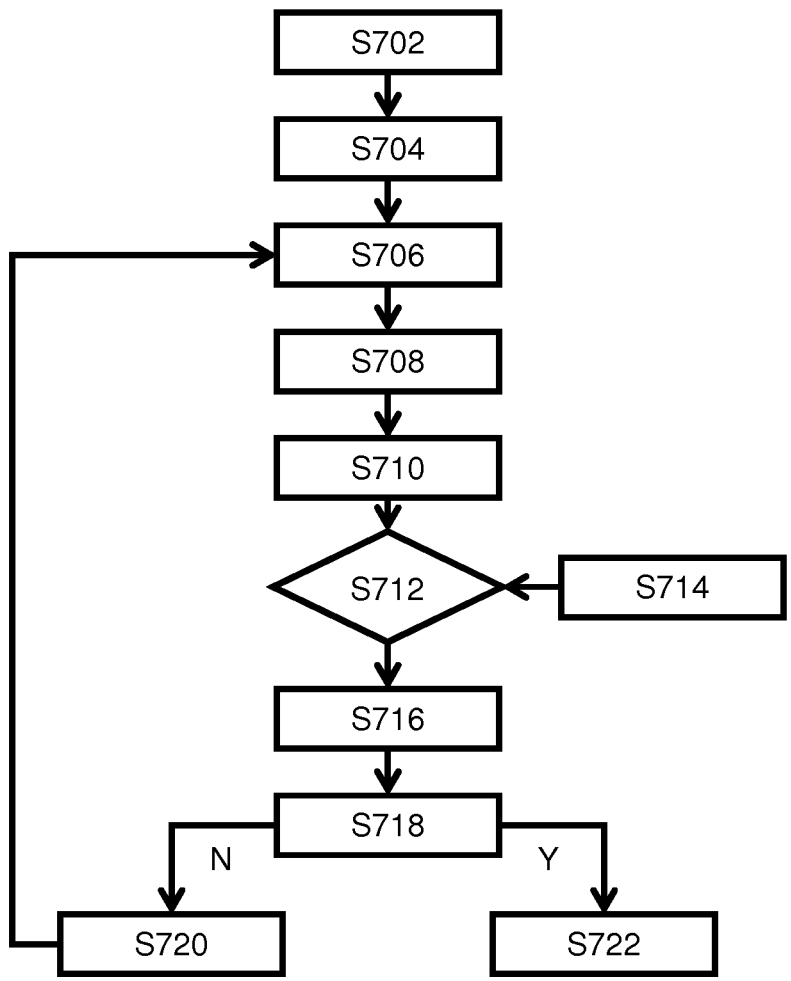

FIG. 13 shows one specific example of how a simultaneous SMLO process can use a Gauss Newton Algorithm for optimization. In step S702, starting values of one or more design variables are identified. A tuning range for each variable may also be identified. In step S704, the cost function is defined using the one or more design variables.

In step S706, the cost function is expanded around the starting values of the design variables. In step S708, a suitable optimization technique is applied to minimize or maximize the cost function. In optional step S710, a full-chip simulation is executed to cover all critical patterns in a full-chip design layout. A desired lithographic response metric (such as CD, EPE or the EPE-based metric described above) is obtained in step S714, and compared with predicted values of those quantities in step S712. In step S716, a process window is determined. Steps S718, S720, and S722 are similar to corresponding steps S514, S516 and S518, as described with respect to FIG. 12A. The final output may be, for example, an optimized illumination map and/or an optimized design layout.

Figure 12B:
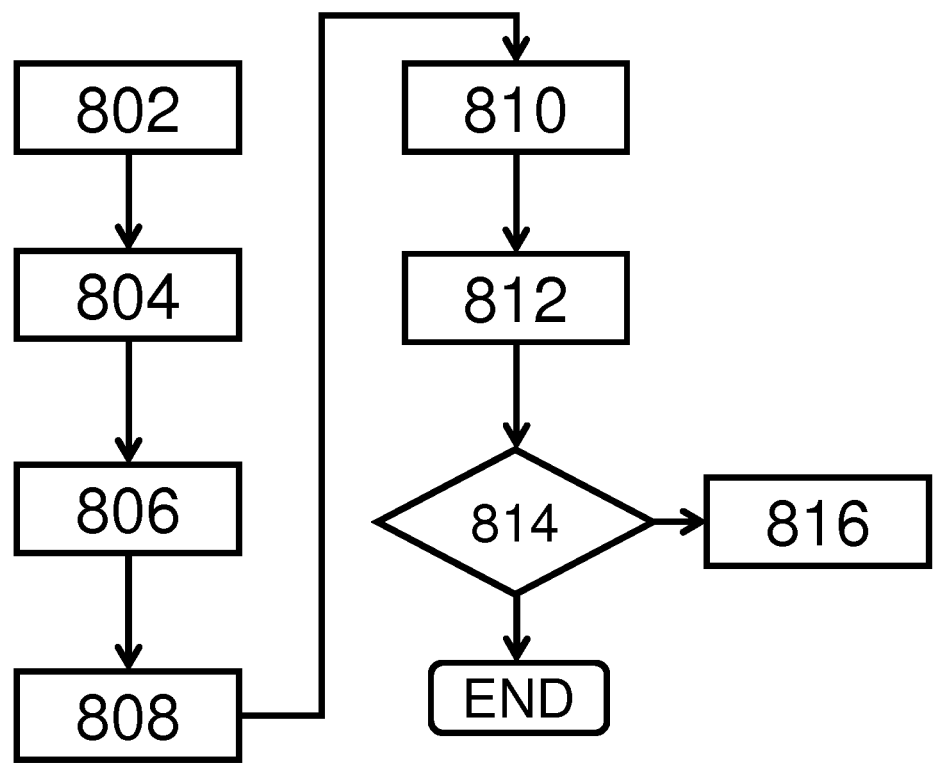

FIG. 12B shows an exemplary method to optimize the cost function where the design variables $(z_1, z_2, \ldots, z_N)$ include design variables that may only assume discrete values.

The method starts by defining the pixel groups of the illumination and the patterning device tiles of the patterning device (step 802). Generally, a pixel group or a patterning device tile may also be referred to as a division of a patterning process component. In one exemplary approach, the illumination is divided into 117 pixel groups per quadrant, and 94 patterning device tiles are defined for the patterning device, substantially as described above, resulting in a total of 211 divisions.

In step 804, a lithographic model is selected as the basis for lithographic simulation. A lithographic simulation produces results that are used in calculations of one or more lithographic metrics, or responses. A particular lithographic metric is defined to be the performance metric that is to be optimized (step 806). In step 808, the initial (pre-optimization) conditions for the illumination and the patterning device are set up. Initial conditions include initial states for the pixel groups of the illumination and the patterning device tiles of the patterning device such that references may be made to an initial illumination shape and an initial patterning device pattern. Initial conditions may also include patterning device pattern bias (sometimes referred to as mask bias), NA, and/or focus ramp range. Although steps 802, 804, 806, and 808 are depicted as sequential steps, it will be appreciated that in other embodiments, these steps may be performed in other sequences.

In step 810, the pixel groups and patterning device tiles are ranked. Pixel groups and patterning device tiles may be interleaved in the ranking Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination higher), and/or according to how an alteration of the pixel group or patterning device tile affects the performance metric.

Once the pixel groups and patterning device tiles are ranked, the illumination and patterning device are adjusted to improve the performance metric (step 812). In step 812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step 812.

In other approaches, patterning device polygon shape adjustments and pairwise polling of pixel groups and/or patterning device tiles are also performed within the optimization process of 812.

In an embodiment, the interleaved simultaneous optimization procedure may include altering a pixel group of the illumination and if an improvement of the performance metric is found, the dose or intensity is stepped up and/or down to look for further improvement. In a further embodiment, the stepping up and/or down of the dose or intensity may be replaced by a bias change of the patterning device pattern to look for further improvement in the simultaneous optimization procedure.

In step 814, a determination is made as to whether the performance metric has converged. The performance metric may be considered to have converged, for example, if little or no improvement to the performance metric has been witnessed in the last several iterations of steps 810 and 812. If the performance metric has not converged, then the steps of 810 and 812 are repeated in the next iteration, where the modified illumination shape and modified patterning device from the current iteration are used as the initial illumination shape and initial patterning device for the next iteration (step 816).

The optimization methods described above may be used to increase the throughput of the lithography apparatus. For example, the cost function may include a $f_p(z_1, z_2, \ldots, z_N)$ that is a function of the exposure time. In an embodiment, optimization of such a cost function is constrained or influenced by a measure of the bandwidth or other metric.

In an embodiment, one or more aberrations (wavefront errors) to which a printed pattern are most sensitive is determined and then one or more parameters of an illumination mode are determined that reduce the effects of those one or more aberrations.

In an embodiment, there is provided a method comprising: obtaining a selected component of optical aberration of or for a lithography apparatus, under a processing condition; computing, by a hardware computer system, an approximate of a cost function, based on the selected component of optical aberration; and producing an adjustment for the lithography apparatus or a patterning process that uses the lithography apparatus, based on the approximate of the cost function.

In an embodiment, the processing condition comprises one or more selected from: a condition of an illumination mode of the lithography apparatus, a condition of a patterning device used in the patterning process, and/or a condition of a projection system of the lithography apparatus. In an embodiment, the method further comprises obtaining the processing condition by optimizing the lithography apparatus or the patterning process without considering any optical aberration. In an embodiment, the selected component of optical aberration is a Zernike coefficient. In an embodiment, obtaining the selected component of optical aberration is based on a sensitivity of a metric that the cost function represents, with respect to the selected component of optical aberration. In an embodiment, the sensitivity of the metric with respect to the selected component of optical aberration is higher than the sensitivity of the metric with respect to the other components of optical aberration. In an embodiment, the sensitivity of the metric with respect to the selected component of optical aberration is above a threshold. In an embodiment, the approximate of the cost function is computed based on the selected component of optical aberration but not the other components of the optical aberration. In an embodiment, producing an adjustment of the lithography apparatus or the patterning process comprises optimizing the lithography apparatus or the patterning process. In an embodiment, producing an adjustment of the lithography apparatus or the patterning process involves a new processing condition, and the method further comprises obtaining a new value of the selected component of optical aberration or a different selected component of optical aberration, under the new processing condition. In an embodiment, the cost function represents a metric relating to an image formed in the patterning process. In an embodiment, the metric is one or more selected from: an edge placement error or function thereof, a process window, a metric characterizing a process window, yield, a stochastic effect, presence or probability of a defect, and/or an interlayer characteristic. In an embodiment, the cost function is a function of a plurality of design variables that represent one or more characteristics of the patterning process. In an embodiment, producing an adjustment of the lithography apparatus or the patterning process comprises producing an adjustment of one or more of the design variables until a certain termination condition is satisfied. In an embodiment, the selected component of optical aberration is among the design variables. In an embodiment, the selected component of optical aberration is a function of one or more of the design variables. In an embodiment, computing the approximate of the cost function comprises computing an approximate of a metric the cost function represents, wherein computing the approximate of the metric comprises: for each of a plurality of selected components of optical aberration, determining a largest value of a pattern characteristic in a group of patterns, caused by that selected component; and averaging the largest values caused by all the selected components. In an embodiment, the approximate of the metric is weighted with another metric and the weighting is adjusted during the computing. In an embodiment, the cost function represents a metric that characterizes a process window. In an embodiment, the method further comprises computing the metric, wherein computing the metric comprises: for each of a plurality of offsets from nominal values of processing parameters that span the process window, determining a largest value of a pattern characteristic in a group of patterns, caused by that offset; and averaging the largest values caused by all the offsets.

Figure 14:
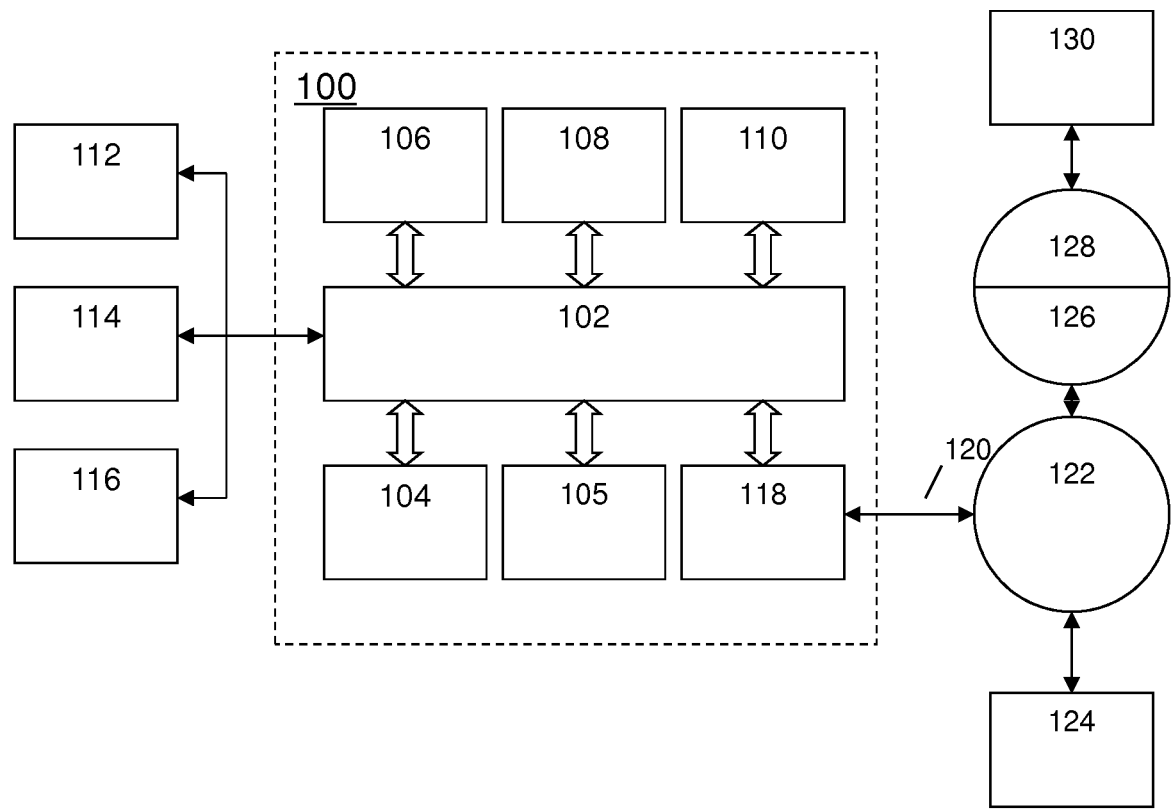
FIG. 14 is a block diagram of an example computer system.

FIG. 14 is a block diagram that illustrates an embodiment of a computer system 100 which can assist in implementing any of the methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for a method or portion thereof as described herein, for example. The received code may be executed by processor 104 as it is received, and/or stored in storage device 110, or other non-volatile storage for later execution. In this manner, computer system 100 may obtain application code in the form of a carrier wave.

Figure 15:
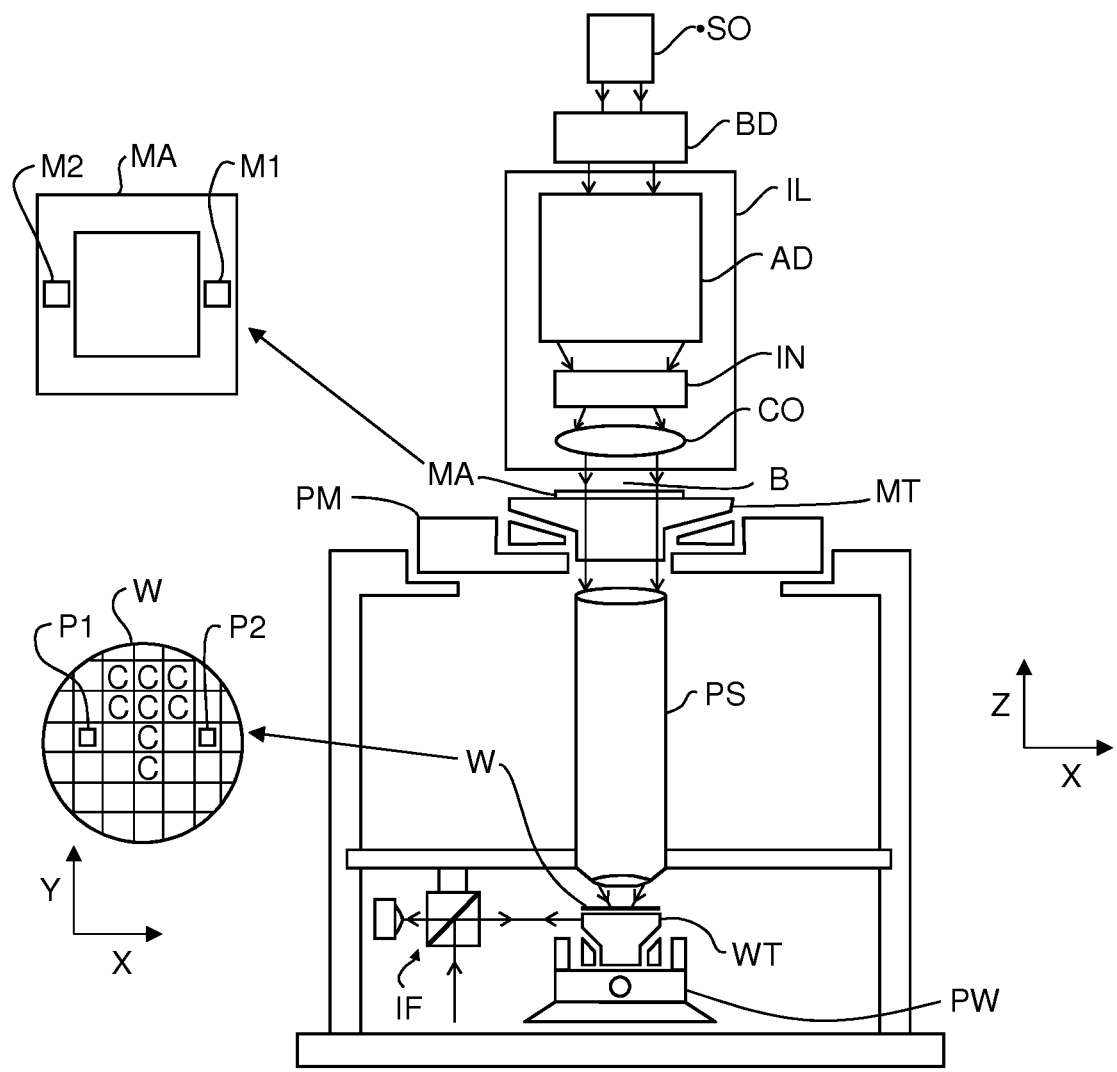
FIG. 15 is a schematic diagram of a lithography apparatus.

FIG. 15 schematically depicts an exemplary lithography apparatus in association with which the techniques described herein can be utilized. The apparatus comprises:
- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 15 that the source SO may be within the housing of the lithography apparatus (as is often the case when the source SO is a mercury lamp, for example), but that it may also be remote from the lithography apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the projection system PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 15. However, in the case of a stepper (as opposed to a step-and-scan tool) the patterning device table MT may just be connected to a short stroke actuator, or may be fixed.

The depicted tool can be used in two different modes:
In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Figure 16:
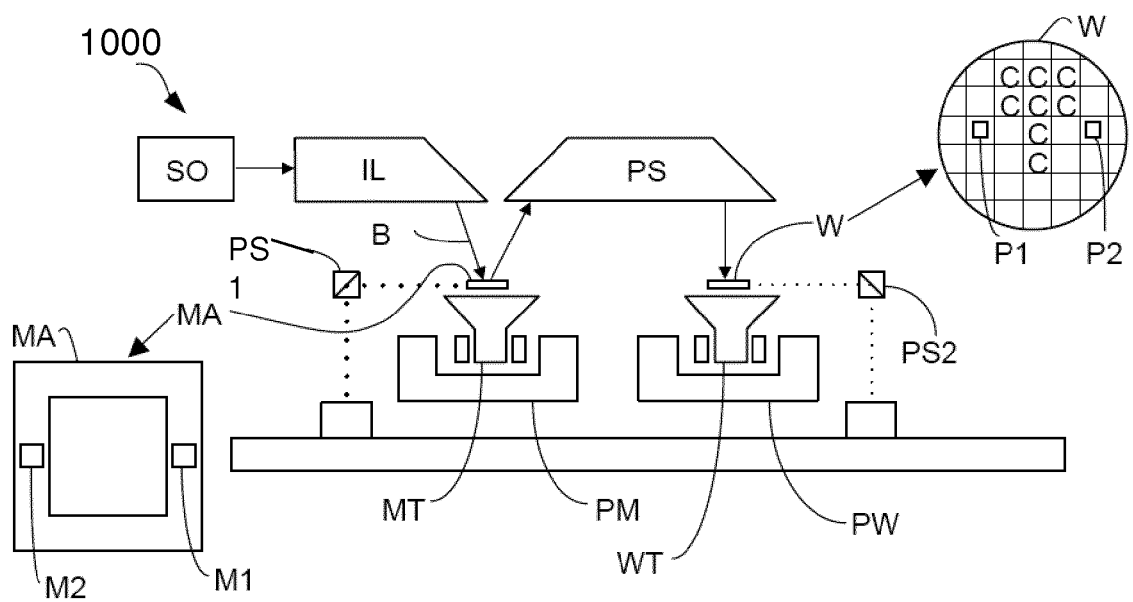
FIG. 16 is a schematic diagram of another lithography apparatus.

FIG. 16 schematically depicts another exemplary lithography apparatus 1000 in association with which the techniques described herein can be utilized.

The lithography apparatus 1000 comprises:
a source collector module SO
an illumination system (illuminator) IL configured to condition a radiation beam B (e.g. EUV radiation).
a support structure (e.g. a patterning device table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 16, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 16, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 17:
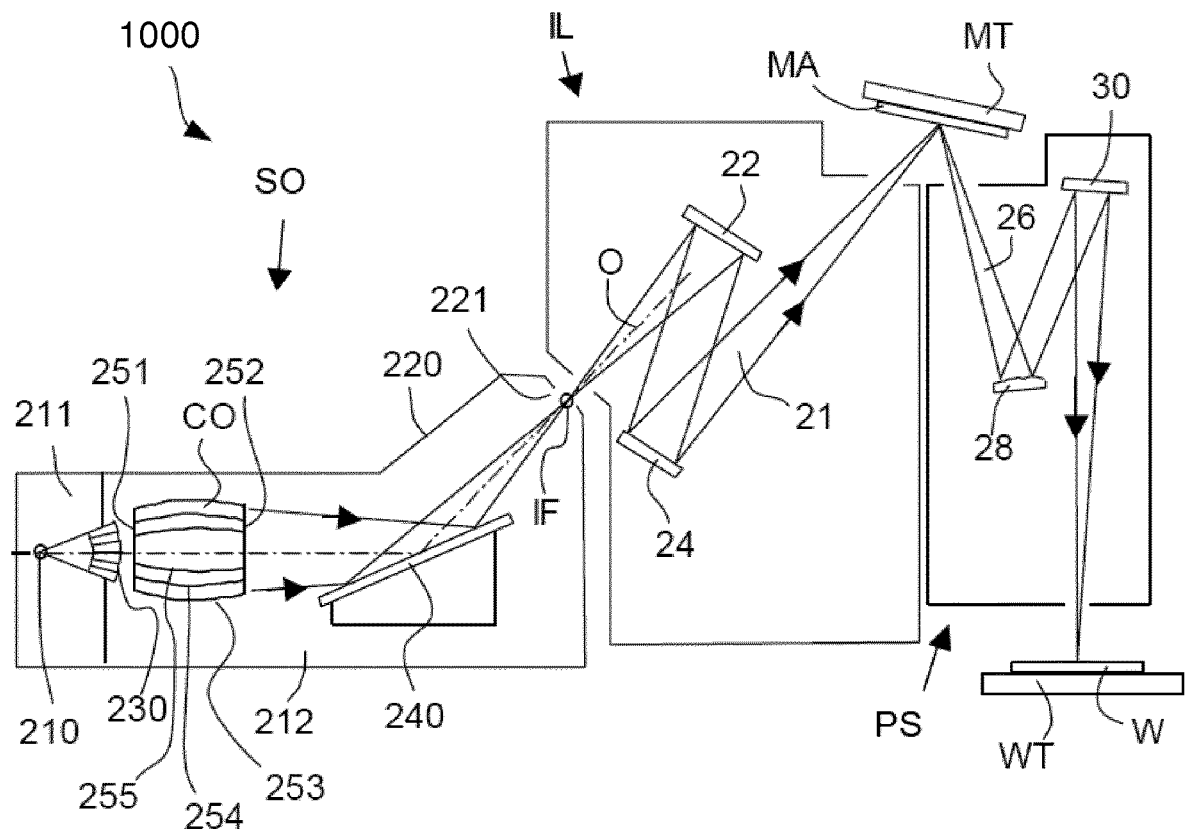
FIG. 17 is a more detailed view of the apparatus in FIG. 16.

FIG. 17 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 17.

Collector optic CO, as illustrated in FIG. 17, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 18:
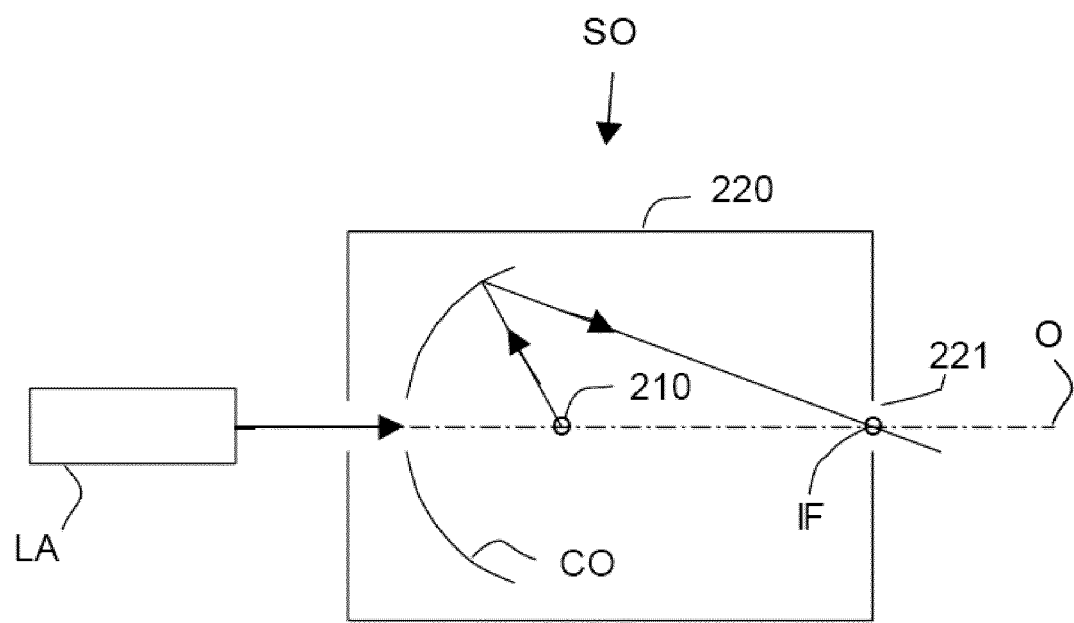
FIG. 18 is a more detailed view of the source collector module SO of the apparatus of FIG. 16 and FIG. 17.

Alternatively, the source collector module SO may be part of an LPP radiation system as shown in FIG. 18. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses

1. A method comprising:
obtaining a selected component of optical aberration of or for a lithography apparatus, under a processing condition;
computing, by a hardware computer system, an approximate of a cost function, based on the selected component of optical aberration; and
producing an adjustment for the lithography apparatus or a patterning process that uses the lithography apparatus, based on the approximate of the cost function.
2. The method of clause 1, wherein the processing condition comprises one or more selected from: a condition of an illumination mode of the lithography apparatus, a condition of a patterning device used in the patterning process, and/or a condition of a projection system of the lithography apparatus.
3. The method of claim 1 or clause 2. further comprising obtaining the processing condition by optimizing the lithography apparatus or the patterning process without considering any optical aberration.
4. The method of any of clauses 1-3. wherein the selected component of optical aberration is a Zernike coefficient.
5. The method of any of clauses 1-4. wherein obtaining the selected component of optical aberration is based on a sensitivity of a metric that the cost function represents, with respect to the selected component of optical aberration.
6. The method of clause 5, wherein the sensitivity of the metric with respect to the selected component of optical aberration is higher than the sensitivity of the metric with respect to the other components of optical aberration.
7. The method of clause 5, wherein the sensitivity of the metric with respect to the selected component of optical aberration is above a threshold.
8. The method of any of clauses 1-7. wherein the approximate of the cost function is computed based on the selected component of optical aberration but not the other components of the optical aberration.
9. The method of any of clauses 1-8. wherein producing an adjustment of the lithography apparatus or the patterning process comprises optimizing the lithography apparatus or the patterning process.
10. The method of any of clauses 1-9, wherein producing an adjustment of the lithography apparatus or the patterning process involves a new processing condition, and the method further comprises obtaining a new value of the selected component of optical aberration or a different selected component of optical aberration, under the new processing condition.
11. The method of any of clauses 1-10, wherein the cost function represents a metric relating to an image formed in the patterning process.
12. The method of clause 11. wherein the metric is one or more selected from: an edge placement error or function thereof, a process window, a metric characterizing a process window, yield, a stochastic effect, presence or probability of a defect, and/or an interlayer characteristic.
13. The method of any of clauses 1-12, wherein the cost function is a function of a plurality of design variables that represent one or more characteristics of the patterning process.
14. The method of clause 13, wherein producing an adjustment of the lithography apparatus or the patterning process comprises producing an adjustment of one or more of the design variables until a certain termination condition is satisfied.
15. The method of clause 13 or clause 14. wherein the selected component of optical aberration is among the design variables.
16. The method of clause 13 or clause 14, wherein the selected component of optical aberration is a function of one or more of the design variables.
17. The method of any of clauses 1-16, wherein computing the approximate of the cost function comprises computing an approximate of a metric the cost function represents, wherein computing the approximate of the metric comprises:
for each of a plurality of selected components of optical aberration, determining a largest value of a
pattern characteristic in a group of patterns, caused by that selected component: and averaging the largest values caused by all the selected components.
18. The method of clause 17. wherein the approximate of the metric is weighted with another metric and the weighting is adjusted during the computing.
19. The method of any of clauses 1-17. wherein the cost function represents a metric that characterizes a process window.
20. The method of clause 19, further comprising computing the metric, wherein computing the metric comprises:
for each of a plurality of offsets from nominal values of processing parameters that span the process window, determining a largest value of a pattern characteristic in a group of patterns, caused by that offset; and
averaging the largest values caused by all the offsets.
21. A computer program product comprising a computer non-transitory readable medium having instructions recorded thereon, the instructions when executed by a computer implementing the method of any of clauses 1-20.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:
1. A method comprising:
obtaining a selected component of optical aberration of or for a lithography apparatus, under a processing condition;
computing, by a hardware computer system, an approximate of a cost function, based on the selected component of optical aberration;
producing an adjustment for the lithography apparatus or a patterning process that uses the lithography apparatus, based on the approximate of the cost function; and outputting the adjustment, or data derived therefrom, for use in or with the lithography apparatus or the patterning process that uses the lithography apparatus, wherein the cost function is a function of a plurality of design variables that represent one or more characteristics of the patterning process, wherein:

producing an adjustment of the lithography apparatus or the patterning process comprises producing an adjustment of one or more of the design variables until a certain termination condition is satisfied, and/or the selected component of optical aberration is among the design variables, and/or the selected component of optical aberration is a function of one or more of the design variables.

2. The method of claim 1, wherein the processing condition comprises one or more selected from: a condition of an illumination mode of the lithography apparatus, a condition of a patterning device used in the patterning process, and/or a condition of a projection system of the lithography apparatus.

3. The method of claim 1, further comprising obtaining the processing condition by optimizing the lithography apparatus or the patterning process without considering any optical aberration.

4. The method of claim 1, wherein the selected component of optical aberration is represented by a Zernike coefficient.

5. The method of claim 1, wherein obtaining the selected component of optical aberration is based on a sensitivity of a metric that the cost function represents, with respect to the selected component of optical aberration.

6. The method of claim 1, wherein the approximate of the cost function is computed based on the selected component of optical aberration but not the other components of the optical aberration.

7. The method of claim 1, wherein producing an adjustment of the lithography apparatus or the patterning process comprises optimizing the lithography apparatus or the patterning process.

8. The method of claim 1, wherein producing an adjustment of the lithography apparatus or the patterning process involves a new processing condition, and the method further comprises obtaining a new value of the selected component of optical aberration or a different selected component of optical aberration, under the new processing condition.

9. The method of claim 1, wherein the cost function represents a metric that characterizes a process window, and further comprising computing the metric, wherein computing the metric, comprises:

for each of a plurality of offsets from nominal values of processing parameters that span the process window, determining a largest value of a pattern characteristic in a group of patterns, caused by that offset; and averaging the largest values caused by all the offsets.

10. The method of claim 1, wherein the cost function represents a metric relating to an image formed in the patterning process.

11. The method of claim 10, wherein the metric is one or more selected from: an edge placement error or a function thereof, a process window, a metric characterizing a process window, yield, a stochastic effect, presence or probability of a defect, and/or an interlayer characteristic.

12. A method comprising:

obtaining a selected component of optical aberration of or for a lithography apparatus, under a processing condition;

computing, by a hardware computer system, an approximate of a cost function, based on the selected component of optical aberration;

producing an adjustment for the lithography apparatus or a patterning process that uses the lithography apparatus, based on the approximate of the cost function; and outputting the adjustment, or data derived therefrom, for use in or with the lithography apparatus or the patterning process that uses the lithography apparatus, wherein computing the approximate of the cost function comprises computing an approximate of a metric the cost function represents, wherein computing the approximate of the metric comprises:

for each of a plurality of selected components of optical aberration, determining a largest value of a pattern characteristic in a group of patterns, caused by that selected component; and averaging the largest values caused by all the selected components.

13. The method of claim 12, wherein the approximate of the metric is weighted with another metric and the weighting is adjusted during the computing.

14. A computer program product comprising a non-transitory computer-readable medium having instructions therein, the instructions, when executed by a computer system, configured to cause the computer system to at least:

obtain a selected component of optical aberration of or for a lithography apparatus, under a processing condition;

compute an approximate of a cost function, based on the selected component of optical aberration;

produce an adjustment for the lithography apparatus or a patterning process that uses the lithography apparatus, based on the approximate of the cost function; and output the adjustment, or data derived therefrom, for use in or with the lithography apparatus or the patterning process that uses the lithography apparatus wherein the cost function is a function of a plurality of design variables that represent one or more characteristics of the patterning process, wherein:

producing an adjustment of the lithography apparatus or the patterning process comprises producing an adjustment of one or more of the design variables until a certain termination condition is satisfied, and/or the selected component of optical aberration is among the design variables, and/or the selected component of optical aberration is a function of one or more of the design variables.

15. The computer program product of claim 14, wherein the cost function represents a metric relating to an image formed in the patterning process.

16. The computer program product of claim 14, wherein the processing condition comprises one or more selected from: a condition of an illumination mode of the lithography apparatus, a condition of a patterning device used in the patterning process, and/or a condition of a projection system of the lithography apparatus.

17. The computer program product of claim 14, wherein the instructions are further configured to cause the computer system to obtain the processing condition by optimizing the lithography apparatus or the patterning process without considering any optical aberration.

18. The computer program product of claim 14, wherein production of an adjustment of the lithography apparatus or the patterning process involves a new processing condition, and the instructions are further configured to cause the computer system to obtain a new value of the selected component of optical aberration or a different selected component of optical aberration, under the new processing condition.

19. The computer program product of claim 14, wherein computation of the approximate of the cost function comprises computation of an approximate of a metric the cost function represents, wherein computation of the approximate of the metric comprises:

for each of a plurality of selected components of optical aberration, determination of a largest value of a pattern characteristic in a group of patterns, caused by that selected component, and averaging of the largest values caused by all the selected components.

20. The computer program product of claim 14, wherein the cost function represents a metric that characterizes a process window, and the instructions are further configured to cause the computer system to compute the metric, wherein computation of the metric, comprises:

for each of a plurality of offsets from nominal values of processing parameters that span the process window, determination of a largest value of a pattern characteristic in a group of patterns, caused by that offset; and averaging of the largest values caused by all the offsets.

21. A computer program product comprising a non-transitory computer-readable medium having instructions therein, the instructions, when executed by a computer system, configured to cause the computer system to at least:

obtain a selected component of optical aberration of or for a lithography apparatus, under a processing condition;

compute an approximate of a cost function, based on the selected component of optical aberration;

produce an adjustment for the lithography apparatus or a patterning process that uses the lithography apparatus, based on the approximate of the cost function; and output the adjustment, or data derived therefrom, for use in or with the lithography apparatus or the patterning process that uses the lithography apparatus, wherein computation of the approximate of the cost function comprises computation of an approximate of a metric the cost function represents, wherein computation of the approximate of the metric comprises:

for each of a plurality of selected components of optical aberration, determination of a largest value of a pattern characteristic in a group of patterns, caused by that selected component; and averaging of the largest values caused by all the selected components.

* * * * *